United States Patent
Yap et al.

(10) Patent No.: US 10,903,261 B1
(45) Date of Patent: Jan. 26, 2021

(54) TRIPLE OUTPUT, DUAL-BAND DETECTOR

(71) Applicant: HRL LABORATORIES LLC, Malibu, CA (US)

(72) Inventors: Daniel Yap, Newbury Park, CA (US); Rajesh D. Rajavel, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/214,139

(22) Filed: Mar. 14, 2014

Related U.S. Application Data

(60) Provisional application No. 61/791,957, filed on Mar. 15, 2013.

(51) Int. Cl.
*H01L 27/14* (2006.01)
*H01L 27/146* (2006.01)
(Continued)

(52) U.S. Cl.
CPC .. *H01L 27/14652* (2013.01); *H01L 27/14625* (2013.01); *H01L 27/14636* (2013.01); *H04N 5/332* (2013.01); *H04N 5/378* (2013.01)

(58) Field of Classification Search
CPC . H01L 29/785; H01L 29/7843; H01L 29/045; H01L 21/823807; H01L 21/84; H01L 27/14; H01L 27/146; H01L 27/1462; H01L 27/1465; H01L 27/1463; H01L 27/14625; H01L 27/14652; H01L 27/14636
(Continued)

(56) References Cited

U.S. PATENT DOCUMENTS

| | | |
|---|---|---|
| 4,183,035 A | 1/1980 | Wang et al. |
| 4,496,788 A | 1/1985 | Hamakawa et al. |
| (Continued) | | |

FOREIGN PATENT DOCUMENTS

JP   05259427 A   10/1993

OTHER PUBLICATIONS

Tokranova, N., et al.,"Hybrid Solar Cells Based on Organic Materials Embedded Into Porous Silicon," Proc. SPIE, 5724, 183-190 (2005).

(Continued)

*Primary Examiner* — Monica D Harrison
(74) *Attorney, Agent, or Firm* — Janus Law Group, PLC

(57) ABSTRACT

An infrared photo-detector and a method for manufacturing it are disclosed. The infrared photo-detector contains a collector region, a first absorber layer absorbing a first wavelength band of incident light, wherein the first absorber layer is disposed between the collector region and the incident light, a second absorber layer absorbing a second wavelength band of light, wherein the first absorber layer is disposed between the second absorber layer and the incident light, at least one first electrical contact coupled with the first absorber layer, at least one second electrical contact coupled with the second absorber layer and at least one third electrical contact coupled with the collector, wherein the at least one third electrical contact provides a current associated with absorbed light of the first wavelength band and absorbed light of the second wavelength band. The method disclosed teaches how to manufacture the infrared photo-detector.

30 Claims, 19 Drawing Sheets

(51) Int. Cl.
*H04N 5/33* (2006.01)
*H04N 5/378* (2011.01)

(58) Field of Classification Search
USPC .................................................. 257/225, 440
See application file for complete search history.

(56) References Cited

U.S. PATENT DOCUMENTS

| | | | |
|---|---|---|---|
| 4,675,525 | A | 6/1987 | Amingual et al. |
| 5,080,725 | A | 1/1992 | Green et al. |
| 5,113,076 | A | 5/1992 | Shulte |
| 5,149,956 | A | 9/1992 | Norton |
| 5,239,179 | A | 8/1993 | Baker |
| 5,457,331 | A | 10/1995 | Kosai et al. |
| 5,559,336 | A | 9/1996 | Kosai et al. |
| 5,581,084 | A | 12/1996 | Chapman et al. |
| 5,721,429 | A | 2/1998 | Radford et al. |
| 5,959,339 | A | 9/1999 | Chapman et al. |
| 5,963,790 | A | 10/1999 | Matsuno et al. |
| 6,180,967 | B1 | 1/2001 | Zanatta et al. |
| 6,294,723 | B2 | 9/2001 | Uematsu et al. |
| 6,545,289 | B1 | 4/2003 | Gunapala et al. |
| 6,852,920 | B2 | 2/2005 | Sager et al. |
| 6,858,462 | B2 | 2/2005 | Zaidi et al. |
| 6,897,447 | B2 | 5/2005 | Mitra |
| 7,129,489 | B2 | 10/2006 | Pham |
| 7,545,051 | B2 | 6/2009 | Yang et al. |
| 7,608,830 | B1 | 10/2009 | Kinch |
| 7,928,389 | B1 | 4/2011 | Yap et al. |
| 8,969,986 | B1 * | 3/2015 | Yap ............... H01L 31/0236 257/432 |
| 2002/0135869 | A1 | 9/2002 | Banish et al. |
| 2004/0045932 | A1 | 3/2004 | Kochergin et al. |
| 2005/0109388 | A1 | 5/2005 | Murakami et al. |
| 2006/0251995 | A1 | 11/2006 | Wille et al. |
| 2008/0072958 | A1 | 3/2008 | Dutta |
| 2008/0111152 | A1 | 5/2008 | Scott |
| 2011/0041901 | A1 | 2/2011 | Shim et al. |
| 2011/0073762 | A1 | 3/2011 | Soma et al. |
| 2013/0228887 | A1 | 9/2013 | Wehner et al. |

OTHER PUBLICATIONS

Technical Information document (SD-12), Characteristics and use of infrared detectors, by Hamamatsu Photonics K. K, pp. 1-43 (2004).

A. Rogalski (Journal of Applied Physics, vol. 93, No. 8, 15, pp. 4355-4391 (2003).

Green, M.A., et al. , "Very High Efficiency Silicon Solar Cells—Science and Technology," IEEE Transactions on Electron Devices, vol. 46, No. 10, pp. 1940-1947 (1999).

Campbell, P., et al., "Light Trapping Properties of Pyramidally Textured Surfaces," J. Appl. Phys., vol. 62.1, American Institute of Physics, pp. 243-249 (1987).

Brendel, R., et al.,"Ultrathin crystalline silicon solar cells on glass substrates," Applied Physics Letters, vol. 70, No. 3, pp. 390-392 (1997).

Swanson, R. M., et al. "Point-contact silicon solar cells," IEEE Transactions on Electron Devices, vol. ED-31, No. 5, pp. 661-664 (1984).

Sinton, R.A., et al., "27.5 percent silicon concentrator solar cells," IEEE Electron Device Letters, vol. EDL-7 No. 10, pp. 567-569 (1986).

Yuan, H.,et al., "FPA Development: from InGaAs, InSb to HgCdTe," Proceedings of SPIE vol. 6940, paper 69403C, (2008).

Ashley, T., et al., "Epitaxial InSb for elevated temperature operation of large IR focal plane arrays," Proceedings of SPIE vol. 5074, pp. 95-102 2003).

Zhao et al. "A 19.8% efficiency honeycomb multicrystalline silicon solar cell with . . . ," IEEE Transactions on Electron Devices, vol. 46, No. 10, pp. 1978-1983 (1999).

Kayes, B. M., et al., "Comparison of the device physics principles of planar and radial p-n junction nanorod . . . " J. Appl. Physics, vol. 97, pp. 114302 (2005).

Hu, L.,, et al., "Analysis of Optical Absorption in Silicon Nanowire Arrays for Photovoltaic Applications," Nano Letters, vol. 7, No. 11, p. 3249 (2007).

Klipstein, P., "XBn barrier photodetector for high sensitivity and high operating temperature infrared . . . ," Proceedings of SPIE, vol. 6940, paper 69402U-1 (2008).

P. Tribolet, et al., "Advanced HgCdTe technologies and dual-band developments," Proceeding of SPIE vol. 6940 (2008), paper 69402P.

M. B. Reine, et al., "Simultaneous MW/LW dual-band MOVPE HgCdTe 64x64 FPAs," Proceedings SPIE vol. 3379 (Apr. 1998), pp. 200-212,.

S. Maimon and G. W. Wicks "nBn detector, an infrared detector with reduced dark current and higher operating temperature," Applied Physics Letters, vol. 89, p. 151109 (2006).

P. Campbell, S. R. Wenham and M. A. Green, "Light trapping and reflection control with tilted pyramids and grooves," Conference Record of the Twentieth IEEE Photovoltaic Specialists Conference, 1988, pp. 713-716.

A. Khoshaklagh, et al. "Bias dependent dual band response from InAs/Ga(ln)Sb type II strain layer superlattice detectors," Applied Physics Letters, vol. 91 (2007), p. 263504.

S. Myers, et al. Comparison of superlattice based dual color nBn and pBp infrared detectors, Proceedings of SPIE vol. 8155 (2011), p. 815507.

G. Destefanis, et al., "Advanced MCT technologies in France," Proceedings SPIE vol. 6542 (2007), p. 65420D.

* cited by examiner

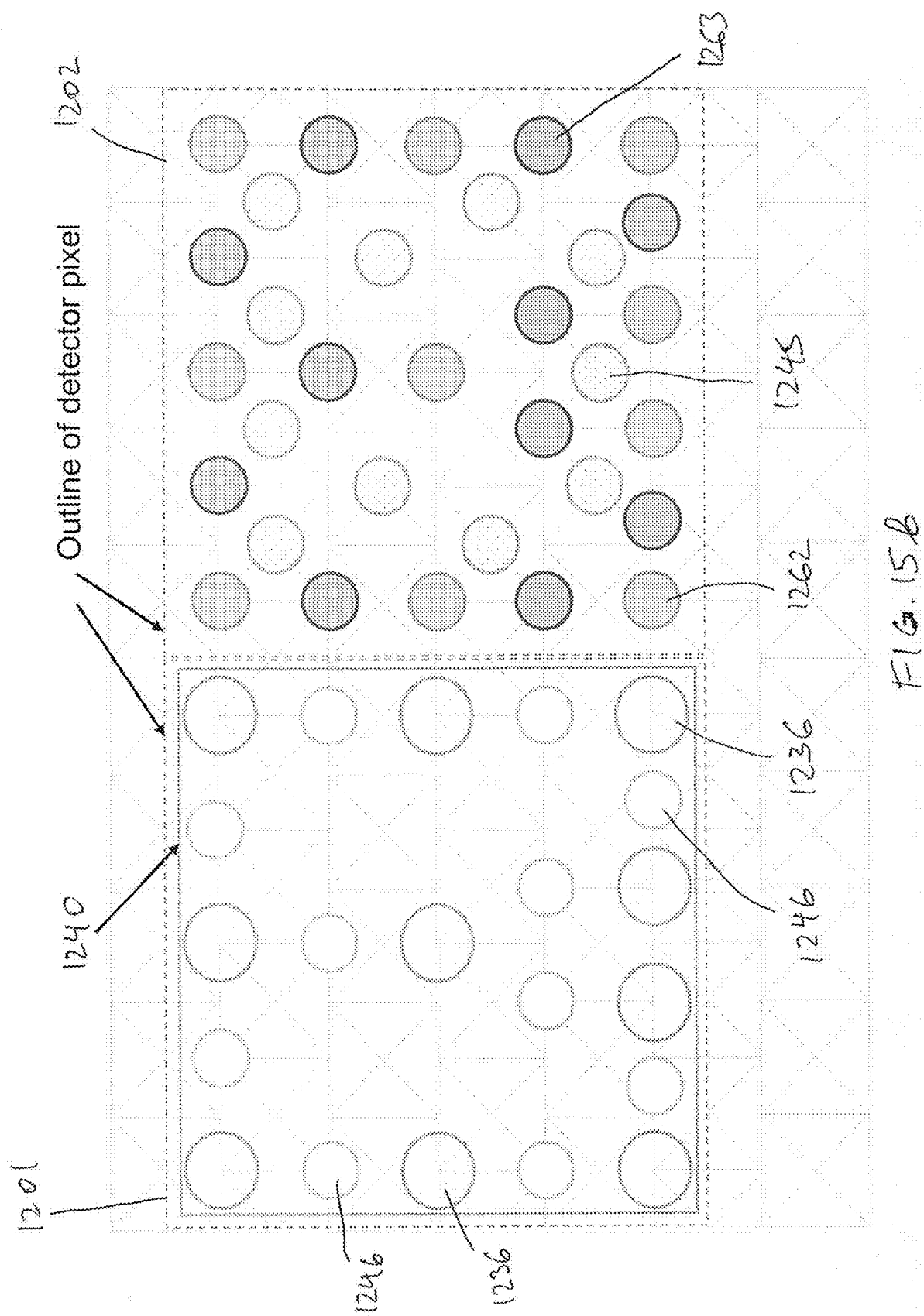
FIG. 15.B

TRIPLE OUTPUT, DUAL-BAND DETECTOR

CROSS REFERENCE TO RELATED APPLICATIONS

This application claims the benefit of U.S. Provisional Application No. 61/791,957, filed on Mar. 15, 2013, which is incorporated herein by reference in its entirety.

FIELD

The present invention relates to detectors of incident light. More particularly, the present invention relates to dual-band detector arrays that provide multiple outputs per detector element of the array.

BACKGROUND

There are a number of prior dual-band detectors that can simultaneously and separately provide the photo-current outputs for detected light of multiple wavelength bands. FIGS. 1a-b show the cross-sectional structure of a prior dual-band detector as described in article by P. Tribolet, et al., "Advanced HgCdTe technologies and dual-band developments," Proceeding of SPIE Volume 6940 (2008), paper 69402P, which is incorporated herein by reference in its entirety, in which each wavelength band is detected by a separate PN diode detector of a given pixel. The two diodes have separate electrical contacts, thereby allowing true simultaneous detection of light in the two wavelength bands. There is a layer comprising wider bandgap material (the NIR barrier) located between the two light-absorbing layers that prevents electrical short-circuiting between the two diodes. This barrier blocks both the electrons and the holes. In general, the light-absorbing layer that absorbs the shorter-wavelength light is located closer to the incident light, which is the layer located closer to the substrate in the case shown in the figure. The array-common electrical contact is made to both absorbing layers, and provides a signal corresponding to the photo-current returns for both wavelength bands.

The light-absorbing layer for the longer-wavelength band is fairly thick, approximately 5 μm in this case, and limits the minimum size of the via-hole that is etched through that second light-absorbing layer to provide access to the first light-absorbing layer buried underneath it. The size of the via hole is generally at least 10 μm, for an aspect ratio of 1:2, and has limited the pixel pitch of these prior detector arrays to being at least 20-24 μm. There can be at most one such via hole for each detector pixel since the bonding pad for the solder bump is located adjacent to that via hole. One weakness of this prior detector is that for each pixel, the detecting regions for the two bands are slightly offset from each other, as shown in FIG. 1b.

Another prior detector has an N—P—N layer structure with the light absorbed in the two n-type layers as described by P. R. Norton, "Two-color radiation detector array and method of fabricating the same," U.S. Pat. No. 5,149,956, issued 22 Sep. 1992, which is incorporated herein by reference in its entirety. This detector, illustrated in FIG. 3a has one electrical output per pixel for the majority-carrier photo-current of the first band and another electrical output per pixel for the majority-carrier photo-current of the second band. The array has a common output, shared among multiple pixels, that provides the combined minority-carrier photocurrents of multiple pixels. As illustrated in FIG. 3b, the p-type layer in between those absorber layers has a larger bandgap so that no light is absorbed in that p-type layer. It is possible to have two electrical outputs for each pixel that contact to the two light-absorbing layers. A third electrical output, which is the array common, contacts to the wide bandgap barrier layer.

Yet another prior dual-band detector has a P-N-P-N structure that is formed by adding a p-type collector layer to the previous N-P-N structure as described in G. R. Chapman and K. Kosai, "Simultaneous two-wavelength P-N-P-N infrared detector, U.S. Pat. No. 5,959,339, issued 28 Sep. 1999, which is incorporated herein by reference in its entirety. For this structure (illustrated in FIG. 4a-b), which has two contacts for each pixel, one contact provides the photo-current output (from the holes) for the longer-wavelength band. A second contact outputs a current that is a difference between the photo-currents for the two wavelength bands. This second contact is made to both the n-type absorber for the longer-wavelength band and the p-type barrier that is between the two absorber layers. To fabricate this contact, the etched opening must expose a portion of the longer-wavelength absorber layer and then also expose a portion of the barrier layer. A third contact provides the photo-current output (from the electrons) for the shorter-wavelength band. This third contact is common to all the detectors of the array and is formed only at the perimeter of the array. The pitch of the detectors of this array is 50 μm.

The detectors described above can provide two separate electrical outputs per pixel. An array of those detectors has a third electrical output that is common to all detectors of the array. A prior detector that can provide three separate electrical outputs per pixel is illustrated in FIGS. 5a-b. This detector contains three mesas that enable those outputs to be presented via three coplanar solder bumps to a readout circuit as described in K. Kosai, et al., "Integrated LPE-grown structure for simultaneous detection of infrared radiation in two bands," U.S. Pat. No. 5,559,336, issued 24 Sep. 1996, which is incorporated herein by reference in its entirety. One output is coupled to the collector layer that collects the photo-generated electrons from the longer-wavelength absorber layer. Another output is electrically connected to a contact made to the shorter wavelength absorber layer. These two outputs provide the photo-currents for the two bands. A third output is electrically connected to a contact made to the longer-wavelength absorber layer and its output is the combined photo-currents for the two bands. This detector has an $N^+$-P-$P^+$-N layer structure and its electronic band structure may be like the one shown in FIG. 5c as described by K. Kosai and G. R. Chapman, "Dual-band infrared radiation detector optimized for fabrication in compositionally graded HgCdTe," U.S. Pat. No. 5,457,331, issued 10 Oct. 1995, which is incorporated herein by reference in its entirety. This band structure facilitates extraction of the electrons generated by absorption of the shorter-wavelength light through the second output and the extraction of the electrons generated by absorption of the longer-wavelength light through the first output. The holes generated by absorption of both the shorter-wavelength and the longer-wavelength light are extracted through the third output. A weakness of this prior detector is that with its three large mesas and thick absorber layers, the size of a pixel is likely 50 μm or larger.

Another prior detector that can provide three outputs per detector has an N—P—B—P—N layer structure (where N-P and P-N represent the doping type of the layers for the two diode detectors and B represents the wide bandgap barrier layer) with the two p-type absorber regions placed directly above each other, as shown in FIG. 2. This detector is described in J. P. Zanatta, et al, "Bicolor infrared detector with spatial/temporal coherence," U.S. Pat. No. 6,180,967 B1, issued 30 Jan. 2011, which is incorporated herein by reference in its entirety, has the 5 layers formed within a depression in the substrate. The overall thickness of these 5 layers is at least 14 μm. Thus, if we assume the same aspect ratio for etching of 1:2, the size of this detector would be at least 30 μm. Each detector can have 3 different electrical outputs—the two electron currents for the two bands plus a hole current obtained by combining the photo-currents for both bands.

FIG. 6 shows the cross-section structure of another prior dual-band detector that has two outputs for each pixel as described in M. B. Reine, et al., "Simultaneous MW/LW dual-band MOVPE HgCdTe 64×64 FPAs," Proceedings SPIE Volume 3379 (April 1998), pp. 200-212, which is incorporated herein by reference in its entirety. This detector is fabricated from a four-layer P-n-N-P structure, with an additional potential barrier for holes located at the n-N interface. In this structure, the longer-wavelength signal is obtained from one of the contacts for each pixel. However, the shorter-wavelength signal is obtained from the array common output. The other pixel-specific output provides the combined electron currents for both the longer wavelength and the shorter wavelength bands. The pixel-specific longer-wavelength signal is obtained from the photo-generated holes of the n-type longer-wavelength absorber layer, via a p-type collector (or cap) layer. The array-common shorter-wavelength signal is obtained from the photo-generated holes of the n-type shorter-wavelength absorber layer via a p-type wide bandgap window layer. The barrier blocks the flow of holes between those two absorber layers and causes those photo-generated holes to flow instead to the contacts. The photo-generated electrons from both layers are not blocked by the barrier. Those electrons can be collected via a contact made to the longer-wavelength absorber layer.

The prior dual-band detector arrays have generally been operated and tested at a device temperature of 77K. At this temperature, the dark-current noise is determined primarily by the thermal generation processes in the carrier-depleted junctions of the device. There is a need to achieve detectors that can operate at higher temperatures, such as 130-150K or even approaching 200K, and still have scene-background limited noise performance. At these higher device temperatures, the thermal generation of carriers in the light-absorbing regions, especially for the longer-wavelength band, also can contribute to or even can dominate the dark-current noise. As a result, there is a need to reduce the volume of the longer-wavelength absorber material as well as reduce the junction area and still achieve high quantum efficiency for conversion from incident photons to output electrical carriers.

FIG. 7 depicts a single band detector (albeit having very wide bandwidth) that can achieve high quantum efficiency with a reduced volume of its light-absorbing material. This detector contains multiple pyramid shaped features formed in each pixel, with those pyramids located on the side of the detector facing the incident light as described by D. Yap, et al., "Wide bandwidth infrared detector and imager," U.S. Pat. No. 7,928,389, issued 19 Apr. 2011, which is incorporated herein by reference in its entirety. The pyramids are etched into a moderately thin light absorbing layer, with the overall thickness of that light-absorbing layer being roughly equal to the longest wavelength of the light to be absorbed. The pyramids are etched only partly through the light-absorbing layer so that there remains a physically continuous base region of the light-absorbing layer to permit the majority carriers to be conducted to electrical contacts formed at the edges of the detector array. This detector also contains mesas etched through the heavily doped collector or extractor layer of the P/N diode. The mesas do not penetrate into the main light-absorbing layer and the mesas face away from the incident light. The pixel-specific electrical contact for a given pixel is formed onto these collector mesas. The spatial extent of a given pixel is defined by the electrical contact made to these mesas. There can be more than one mesa for each pixel and there are multiple pyramids in each pixel.

For this detector, the light is incident from the side containing the pyramids rather than from the substrate side of the detector. Thus, this detector is unlike the prior detectors illustrated in FIGS. 1-6. The pyramid-shaped regions of the light-absorbing layer do not specifically define the extent of a pixel but rather they extend throughout the light-facing surface of the array. Instead, the pixel is defined by the extent of the electrical contact made to the one or more collector mesas comprising a pixel. The electrical contact made to the light-absorbing layer is the common contact of the detector array.

FIG. 8 depicts another single band detector (likewise having very wide bandwidth) that has only a thin layer of light-absorbing material. This detector contains multiple pyramid shaped features formed in each pixel, with those pyramids being transparent to the wavelengths of light to be absorbed as described by D. Yap and R. D. Rajavel, in U.S. application Ser. No. 13/372,366 "Wideband detector structures," filed on Feb. 13, 2012, which is incorporated herein by reference in its entirety. Those pyramids are located on the side of the detector facing the incident light. The pyramids are located above the thin and laterally continuous light absorbing layer. Although the thickness of the light-absorbing layer is much less than the 1/e absorption length for that material, it is possible to achieve quantum efficiency well above 80% over the entire wide range of wavelengths sensed by this detector. Deep dips in the absorption spectrum, at which wavelengths the absorption is greatly reduced, are avoided by forming multi-stepped mesas of the collector regions and/or oxide spacers of various thickness that separate the light-absorbing layer from a metal reflector located at the backside of the device.

FIG. 9 depicts a dual-band detector with a reduced volume of the light-absorbing material for the longer-wavelength band as described by D. Yap, et al., in U.S. application Ser. No. 13/036,403 "Infrared Detector," filed on Feb. 28, 2011, which is incorporated herein by reference in its entirety. Light is incident from the substrate side of that device. For that detector (see FIG. 9), the growth substrate is preferably thinned but does not need to be removed completely. Pyramids are formed in the thinned substrate and serve to improve the coupling of light into the light absorbing regions. The light absorbing regions for the longer-wavelength band are laterally separated from each other and are surrounded by voids that may be filled with a transparent, low-refractive-index material. A metal reflector at the backside of the detector acts in combination with these trapezoidal shaped light-absorbing regions to achieve efficient trapping and absorption of the light. The light-absorbing region for the shorter-wavelength band is a laterally contiguous layer. This prior detector has a single electrical output per pixel as well as an array common output. Thus, the dual-band operation is achieved by switching the bias voltage applied to a detector pixel.

In view of the limitation in prior art, a need exists for improved dual-band detector arrays with compact detector pixels that can provide as many as three outputs per detector pixel.

BRIEF DESCRIPTION OF THE FIGURES

FIGS. 15a-b depict another embodiment of a detector according to the present disclosure.

Figure 1A:
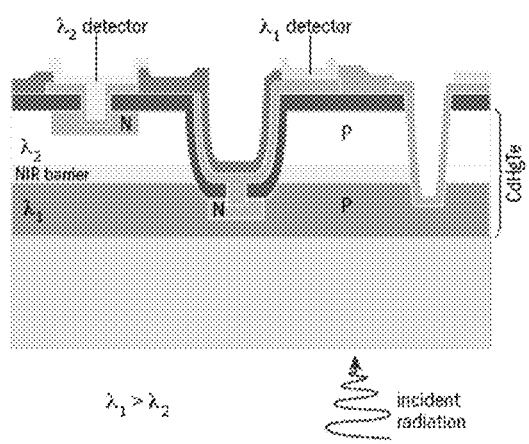
FIGS. 1a-b depict a detector known in the art.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In one embodiment, the presently disclosed array of photo-detectors for an infrared focal-plane array imager provides pixel-specific adjustment of the output photo-current from each wideband photo-detector of the array based on the separate photo-currents from two sub-bands (within that wide bandwidth) obtained from that photo-detector or from some combination of nearby photo-detectors. Each photo-detector can simultaneously and separately provide three pixel-specific output photo-currents. These are a primary output signal that is the sum of the photo-currents for both sub-bands (i.e., the wideband photo-current) and two secondary outputs that are the photo-current signal for the shorter wavelength band and the photo-current signal for the longer-wavelength band. These three signals could be coupled separately to a readout circuit so that their combination can be done in the readout circuit. In one embodiment, that combination, which might, for example, involve subtracting a weighted amount of the photo-current for one band from the wideband photo-current, would be done before that wideband photo-current signal is integrated by the readout circuit. In another embodiment, the outputs from the individual detectors can be combined and interconnected on the array itself in a way determined or configured by the readout circuit such that the primary signal for each detector that is coupled to the readout circuit is actually adjusted according to some combination of the weighted sub-band photo-current outputs for one or more nearby detector pixels of the array.

Although each detector can have such great flexibility in its electrical output connections, the size of a detector can be relatively small, with a typical detector-to-detector (or pixel-to-pixel) spacing of about, for example, 12-25 µm. The photo-detectors have a light-absorbing layer for the longer-wavelength band whose thickness is several times smaller than the wavelength of the light in that band. This thin layer ensures that any structure that must be etched to permit access to the various layers of the detector is sufficiently thin that multiple etched openings can be located within the space associated with one detector pixel of the imaging array. Also, the detector array has a multi-layer metal interconnect structure fabricated on its backside (i.e., the side facing the readout circuit) that can be designed to provide a particular desired electrical output configuration that suits the requirements of the readout circuit without significantly increasing the overall size of a detector.

In one embodiment presently disclosed, the plurality of detectors comprise a first light-absorbing layer of a first light-absorbing material and a second light-absorbing layer of a second light-absorbing material. The first light-absorbing layer is located between a side of the photo-detector array that faces the incident light and the second light-absorbing layer. Thus, the incident light to be absorbed by the second light-absorbing layer must first pass through the first light-absorbing layer. The absorption cutoff wavelength of the first light-absorbing material is shorter than the absorption cutoff wavelength of the second material. These values of these two absorption wavelengths define the band of wavelengths of light absorbed primarily by the second light-absorbing layer. Thus, the first light-absorbing material is transparent to the band of wavelengths of the light absorbed primarily by the second light-absorbing regions. Each detector of the plurality of detectors also has a collector region that is located on the side of the second light-absorbing layer facing away from the incident light, and the side of the second light-absorbing layer opposite the side facing the first light-absorbing layer. The absorption cut-off of the material comprising these collector regions preferably is at a shorter wavelength than the absorption cutoffs of both the first and second materials.

In one embodiment, photo-detectors of the presently disclosed array comprise two carrier-selective barriers that direct photo-generated majority carriers resulting from light in a first wavelength band that is absorbed by first light-absorbing layer to a set of first electrical contacts and direct photo-generated majority carriers resulting from light in a second wavelength band that is absorbed by second light-absorbing layer to a set of second electrical contacts. The detectors also have an electronic band structure that directs photo-generated minority carriers resulting from light absorbed in both the first and the second light-absorbing layers to a set of third electrical contacts via the collector regions. In one embodiment, both the first light-absorbing layer and the second light-absorbing layer are n-type. For this embodiment, the first barrier, located between the first light absorbing layer and the second light absorbing layer, passes a first type of electrical carrier (e.g., holes) but blocks the opposite type of electrical carriers (e.g., electrons). In addition, the detectors also have a second barrier located between the second light-absorbing layer and the collector regions. That second barrier also passes the first type of electrical carrier (e.g., holes) and blocks the second type of electrical carrier (e.g., electrons) photo-generated in the second light-absorbing layer. This particular combination of the two barriers and the carrier types for the two light-absorbing layers achieves the three desired electrical outputs for a detector.

In some embodiments, the presently disclosed photo-detectors comprise a first set of metal posts or metal-filled vias that abut and electrically connect to the first electrical contacts. That first set of metal posts or metal-filled vias occupies voids formed between or in the second light-absorbing layer. The detectors also can include a second set of metal posts or metal-filled vias that abut and electrically connect to the second electrical contacts. That second set of metal posts or metal-filled vias occupies spaces formed between or in the collector regions. The metal posts or metal-filled vias enable the detectors to occupy a smaller area. The first set of metal posts or metal-filled vias also occupies spaces formed between or in the collector regions. The detectors further include two or more metal interconnect layers and one or more dielectric spacer layers, with each of these insulator layers separating two metal interconnect layers. The result is a relatively planar set of electrical bond pads for interfacing to the read-out integrated circuit (ROIC) of an imager. The detector array can also include interconnect bumps, which typically are solder bumps. Those interconnect bumps electrically connect the detector array to the electronic ROIC that is located on the side of the detector away from the incident light.

The first and the second light-absorbing layer each can include laterally contiguous regions that extend over multiple detector pixels. Those laterally contiguous regions provide paths for conducting carriers photo-generated in the first and the second light-absorbing regions through multiple pixels. For some embodiments, even when the two light-absorbing regions are laterally contiguous, electrical cross-talk between different detector pixels may be suppressed by locating the metal posts or metal-filled vias and the electrical contacts to the first light-absorbing layer around the perimeter of each detector pixel. As a result of this placement of the electrical contacts for the first light-absorbing layer, the photo-current associated with the first wavelength band is primarily extracted from each pixel rather than flowing to an adjacent pixel. Similarly, the metal posts or metal-filled vias and the electrical contacts to the second light-absorbing layer also may be located around the perimeter of each detector pixel. Again, as a result of this placement of the electrical contacts for the second light-absorbing layer, the photo-current associated with the second wavelength band is primarily extracted from each pixel rather than flowing to an adjacent pixel. In some embodiments, the relative amounts of the photo-current conducted in a light-absorbing layer that is extracted from a pixel and the photo-current conducted in that light-absorbing layer that is extracted from other pixels nearby or adjacent to that pixel can be set by configuring the number and locations of the electrical contacts made to that light-absorbing layer.

In some embodiments, the presently disclosed detectors comprise pyramid-shaped features located on the side of the detectors facing the incident light and multi-stepped optical reflectors located on the side of the detectors away from the incident light. These features and reflectors facilitate the trapping and absorption of light in the first and second light-absorbing regions. The pyramids can be made from a wider bandgap material that is transparent to the light of both wavelength bands.

In one embodiment, the presently disclosed detectors comprise regions of low refractive-index dielectric material that fills spaces between the collector regions. In one embodiment, the detectors also can comprise regions of low refractive-index dielectric material that separate the edges of the vias or voids formed in the second light-absorbing layer and in the collector regions from the metal posts or metal film in those vias or voids. The detector array can further include a first set and a second set of metal interconnects. The metal interconnects, which are at multiple layers, also act as optical reflectors. The detector arrays can also include a dielectric spacer that separates the first and second set of metal interconnects. The dielectric filled voids at the second light-absorbing layer and the dielectric filled voids in the collector regions or the dielectric filled areas between the collector regions act to form a multi-stepped relief pattern that, in combination with the various levels of optically reflecting metal interconnects and the dielectric spacers between them, facilitate the trapping of the incident light in the detectors to increase their absorption efficiency. This increased absorption efficiency allows the detector to have thinner light-absorbing layers than possible with prior detectors.

In some embodiments, each detector of the disclosed dual-band photo-detector array could present as many as 3 different electrical outputs to the readout circuit. However, the size of the detector and the pixel-to-pixel spacing can still be small, smaller than 25 µm, to make possible large-format array imagers (e.g., 1000×1000 pixels, and larger). The size of the readout circuitry associated with a given detector pixel is dominated by the integration capacitor of the readout circuit. For large-format imagers having small pixel-to-pixel pitch, there may be sufficient space for only one integration capacitor in each pixel. The disclosed detector makes it possible for there to be some pixel-level image pre-processing to condition the signal current delivered to that integration capacitor. For example, each detector could have an output connected to the integration capacitor that is the sum of the photo-currents for both wavelength bands of the incident light. However, a percentage of the photo-current for the first band and/or a percentage of the photo-current for the second band could be subtracted from that summed photo-current. These subtracting photo-current signals could be supplied from that same pixel and/or from adjacent or nearby pixels of the array. The subtracting photo-currents could be scene dependent and could be selected or switched or routed by the readout circuit. The multi-layer metal interconnection formed at the backside of the detector array makes it possible to achieve detectors that present many different combinations of electrical outputs to the readout circuit while minimizing the area of a pixel. An adaptive readout circuit could use these outputs for pixel-level image pre-processing functions such as adaptive detection-threshold adjustment, wavelength specific photo-current cancellation, contrast enhancement, edge enhancement, etc. before the signals are read out. Given the complexity and density of silicon-based electronic circuitry that now is available, the disclosed detector array, when coupled to such circuitry, can make possible real-time, self-adapting, compact imagers having an image-processing capability that approaches the capability of human and animal visual systems.

In an embodiment, the photo-detectors of the presently disclosed photo-detector array can provide wideband detection while simultaneously detecting and distinguishing between light in two different wavelength bands within that wide bandwidth. When such a photo-detector array is used in an optical imager, the wideband images can be adjusted pixel-by-pixel such that the effective absorption spectrum for each pixel is tailored, in real time, according to the separate photo-current signals for the two bands. Also, the effective images at those two bands are spatially registered with each other because the light-absorbing materials for the two bands are physically vertically aligned to each other. The photo-detectors of the disclosed array have reduced volume of the photon-absorber material because the first and second light-absorbing layers are thin and they also may have areas in which their light-absorbing material has been removed. Thus, the photo-detectors can achieve reduced dark current (and improved noise performance) at temperatures higher than typical cryogenic temperatures (e.g., at temperatures of 130-200K, depending on the cut-off wavelength of its light-absorbing material).

Compared to prior dual-band sensing infrared detectors, the second light-absorbing layer of the presently disclosed detectors is atypically thin. The thickness of this layer is less than the wavelength of the light to be absorbed in the second light-absorbing layer and even could be less than ¼ the wavelength of that light. Despite the thin absorber layer, the absorption efficiency for this wavelength band is much greater than 50% and could be greater than 80%. In contrast, the thickness of the longer-wavelength light-absorbing regions of prior dual-band detectors is greater than the wavelength to be absorbed and for many prior devices is two times the value of the wavelength. The thin second light-absorbing layer (typically having a thickness of 1-2 µm, which is smaller than one to one-half the wavelengths of the light (e.g., between 3.5 µm and 5 µm) absorbed primarily by the second light-absorbing layer) means that vias etched through that second light-absorbing layer to make electrical contact to the first light-absorbing layer can have small area and also can be placed close to each other. Furthermore, the collector regions also can be very thin, generally with a thickness of 0.1-0.3 µm. As a result, vias etched through the collector regions to make electrical contact to the second light-absorbing layer also can have small area and be placed close to each other. Because this small via size and close via spacing are possible, each detector pixel can have three different electrical contacts made to it.

Many high-sensitivity focal-plane photo-detector arrays for detecting light at mid-wave infrared (MWIR) wavelengths or longer need to be cooled to cryogenic temperatures (e.g., 77K and lower) in order to sufficiently reduce their internally produced noise current to levels that are below the background noise of the scene. However, cryogenic coolers, such as Stirling coolers, are bulky and they involve moving parts that can reduce the reliability of the overall system. If the operating temperature of the detector array can be increased to 200K and higher, it approaches the range of temperatures that can be attained by thermoelectric (TE) coolers that do not involve moving parts. If the operating temperature can be increased even to 150K, it can be cooled by radiative means for imagers used in space.

Thus, there is a need for infrared detector arrays that can operate with low noise current at temperatures of 150K and higher.

The noise current of an un-illuminated infrared detector, or its dark current, has several major components. One component is a generation/recombination current (G/R current) that results from G/R centers at material interfaces such a homojunctions or heterojunctions in the detector. Another component is a diffusion current that, for high quality materials, is limited by thermal generation in the bulk of the light-absorber material. Yet another component is a surface-recombination current due to interface electronic states resulting from un-passivated dangling chemical-bonds at the outer boundaries of the detector semiconductor material. For many common infrared detector materials, such as HgCdTe and antimony-based compounds, the G/R current typically dominates the dark current at low temperatures, such as below 120K. However, at higher temperatures, the diffusion current and the thermal generation within the bulk absorber regions dominate the dark current. This diffusion current is especially significant for the longer-wavelength absorber material, which has a smaller energy bandgap.

One way to reduce the diffusion current at the higher operating temperatures is to reduce the volume of the absorber material. However, this reduction of absorber volume typically also results in a reduction of the photon absorption efficiency and the quantum efficiency of the infrared detector. The disclosed detector achieves both reduced diffusion current as well as high absorption efficiency to permit operation at higher temperatures. The reduced diffusion current is accomplished by reducing the volume of absorber material, for a given input cross-sectional area of detector array or, alternatively, a given pixel area. The high absorption efficiency is achieved by using geometrical features that greatly reduce the net front-side reflection of the incident light and that also trap the incident light such that the light makes multiple passes through the absorber regions.

Figure 10A:
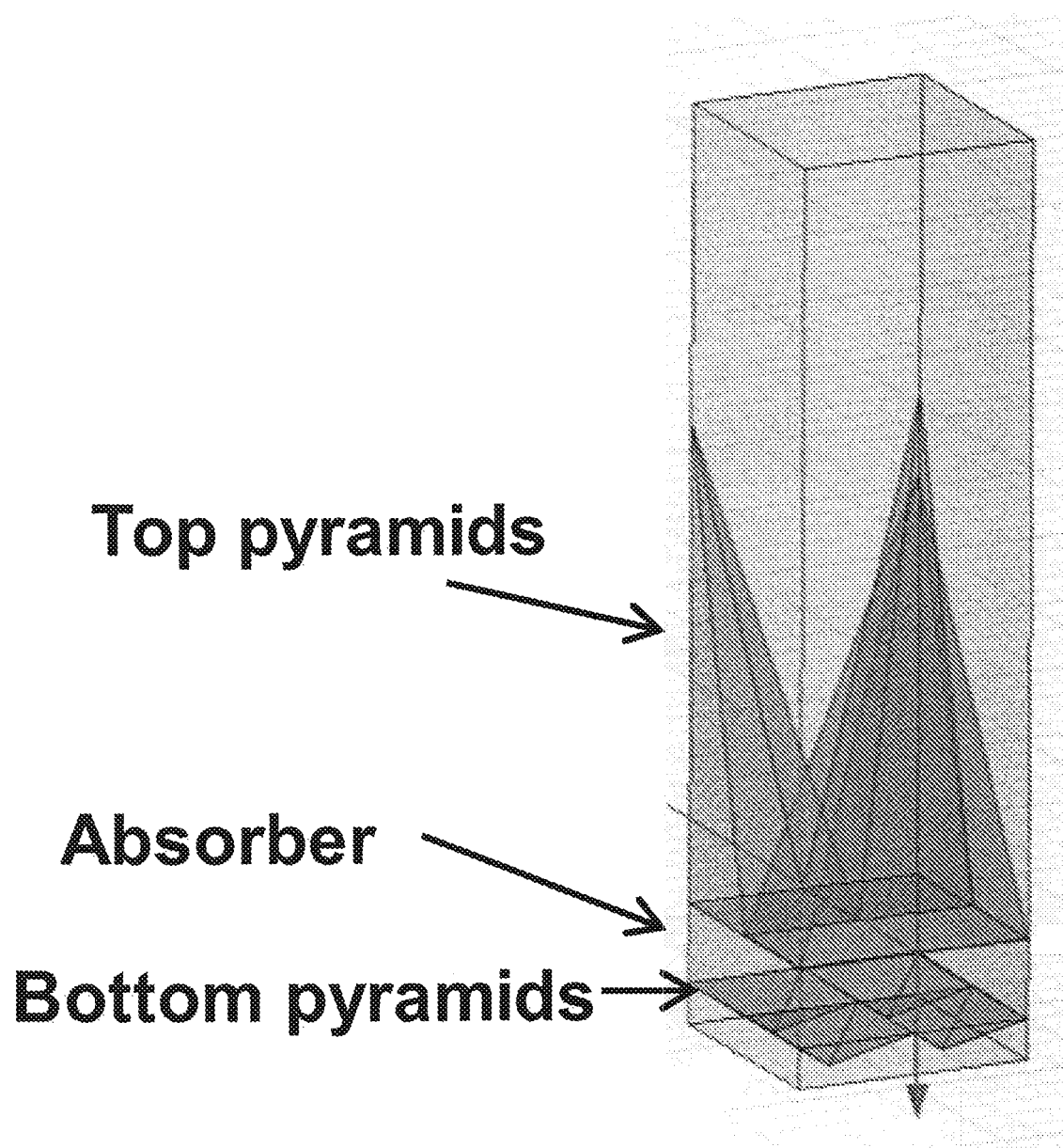
FIGS. 10a-b depict simulation results according to the present disclosure.

In some embodiments according to the present disclosure, a high absorption efficiency is achieved with a set of pyramid-shaped features located on the side of the detector facing the incident light, a thin layer (or layers) of the light-absorbing material, some shaped or multi-stepped features located on the backside of the detector (away from the incident light) and also a reflector located at the backside. These geometric features can be transparent to the incident light but preferably consist of material that have a high refractive index, with the refractive index value preferably approximately equal to the refractive index of the light-absorbing material. FIG. 10a depicts a unit cell that was used for simulations of the absorption characteristics of such a detector structure. The larger pyramids have an offset-grid arrangement such that the pyramids of successive rows are staggered by one-half spacing. Because of the symmetry of the overall structure, the unit cell includes only ¼ of two pyramids and ½ of a third pyramid, with the centers of those pyramids located at the corners or at a side of the unit cell. The pyramids on the other side of the absorber layers have a base width that is ½ the base width of the pyramids located on the first side. Thus, the simulation unit cell contains 4 of those smaller pyramids. It is assumed that there are many pyramids located in each detector pixel. For the simulations shown herein, the bases of the pyramids have a width of either 3 µm or 1.5 µm.

Figure 10B:
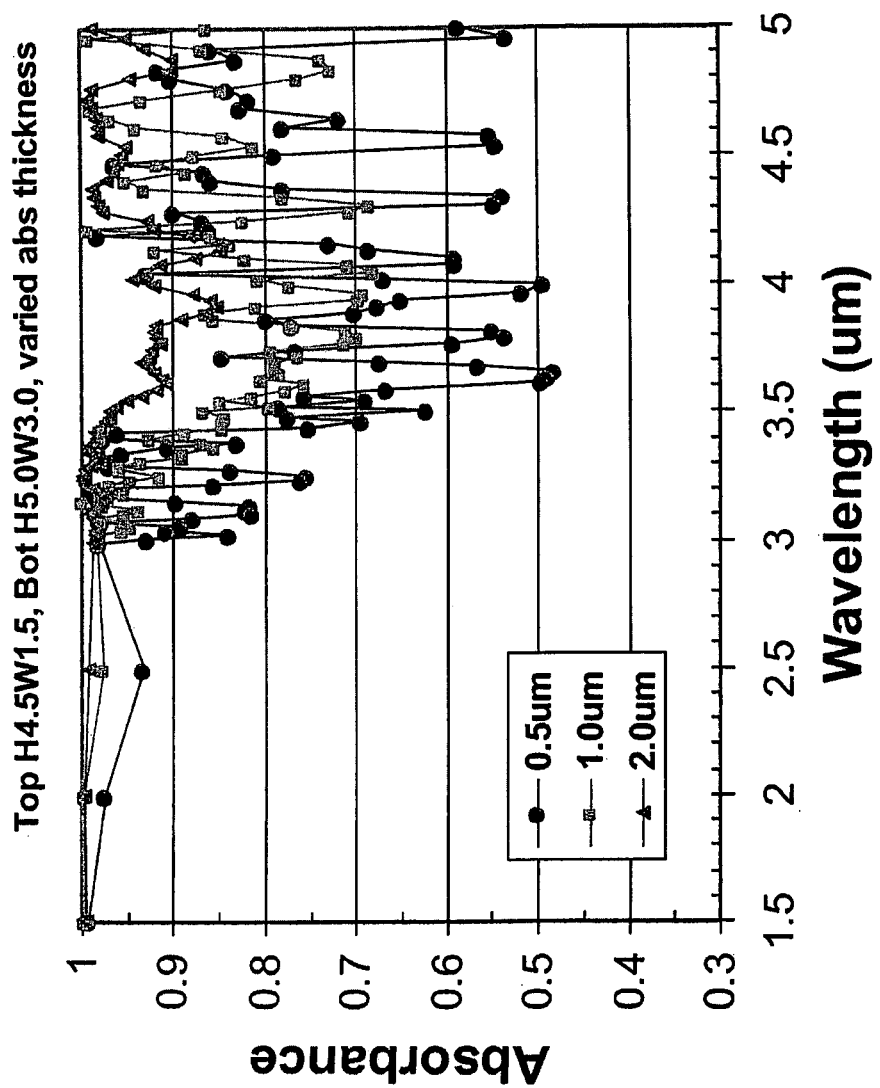

A structure was considered for which the pyramids facing the incident light have a base-width of 1.5 µm and a height of 4.5 µm. These pyramids are arranged in a square grid pattern. The pyramids on the opposite side have a base-width of 3 µm and a height of 5 µm. These pyramids are arranged in an offset-grid pattern. We varied the thickness of the absorber layer that is located between the two layers of pyramids. FIG. 10b shows that the absorbance (ratio of absorbed power versus incident power) can be greater than 0.85 for all wavelengths of the incident light in the range between 1.5 and 5.0 µm when the thickness of the absorber layer is only 2 µm. When the absorber thickness is reduced to 1 µm, the absorbance is still approximately 0.7 or greater over the entire wavelength range.

Figure 11B:
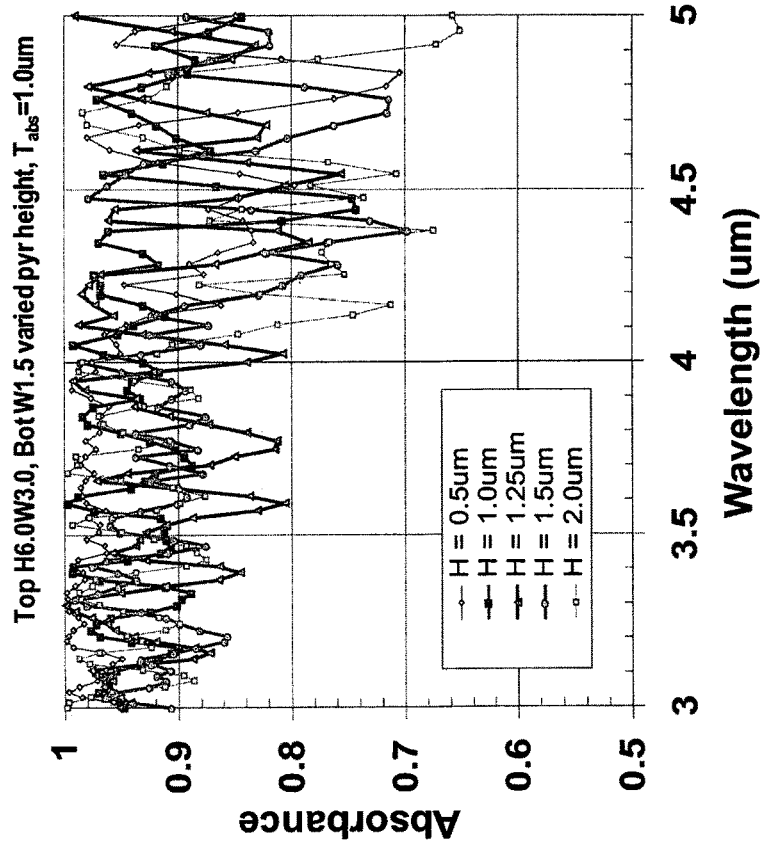
FIGS. 11a-b depict simulation results according to the present disclosure.
Figure 11A:
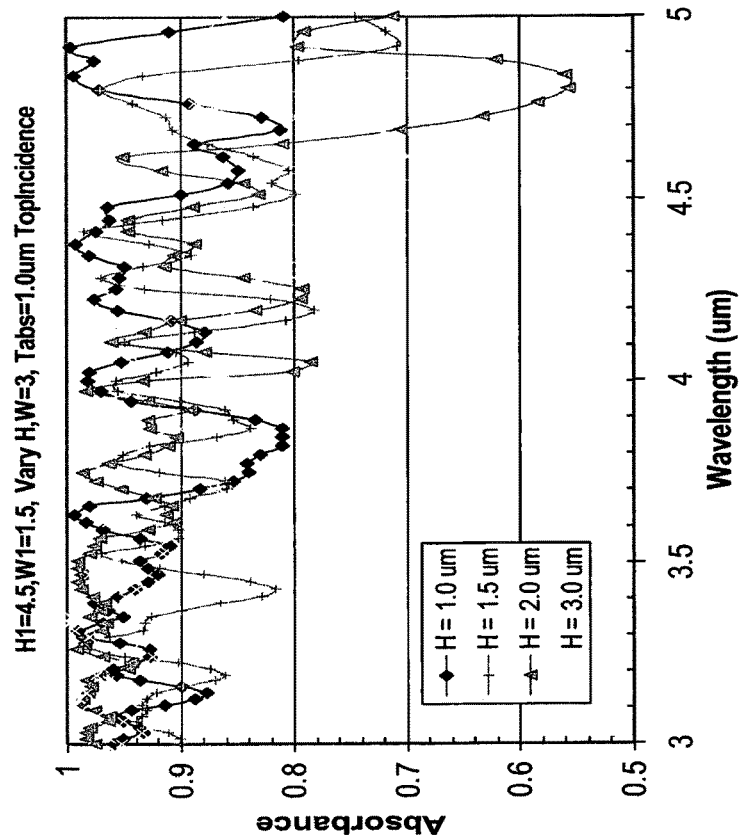

In one embodiment, higher absorbance is achieved by using shallow pyramids at the backside of the absorber layer. FIG. 11a-b show results obtained for structure comprising shallow backside pyramids. FIGS. 11a and 11b show results for cases for which the base-width of the backside pyramids is 3 µm or 1.5 µm, respectively. In all of these cases, the thickness of the absorber layer is about 1.0 µm. These results indicate that the absorbance can be greater than 75-80% for all wavelengths in the mid-wavelength infrared (MWIR) range when the height of the backside pyramids is approximately 0.5-1.25 µm. In one embodiment, the high absorbance is achieved for both values of the pyramid base width considered and for the two different sizes of the top-side pyramids that were considered.

The absorber layer of these simulation structures may be considered as representing the longer-wavelength absorber layer of a dual-band detector, since the shorter-wavelength absorber material is transparent to that longer-wavelength light. Thus, if the individual detectors of an array are defined by etching via-holes, mesas or other surface-relief features into the epitaxially grown material layers of the detector structure, the overall depth of the etched features can be fairly shallow (e.g., 2 µm or less) if etching is only through the longer-wavelength absorber layer and the multiple detectors of an array are electrically isolated from each other, to minimize their crosstalk, other than etching mesas that extend completely through the shorter-wavelength absorber layer. In one embodiment, this electrical isolation is achieved by forming electrical contacts at and around the periphery of each detector. Those electrical contacts serve to define the spatial extent of the current flow for each detector.

Figure 12:
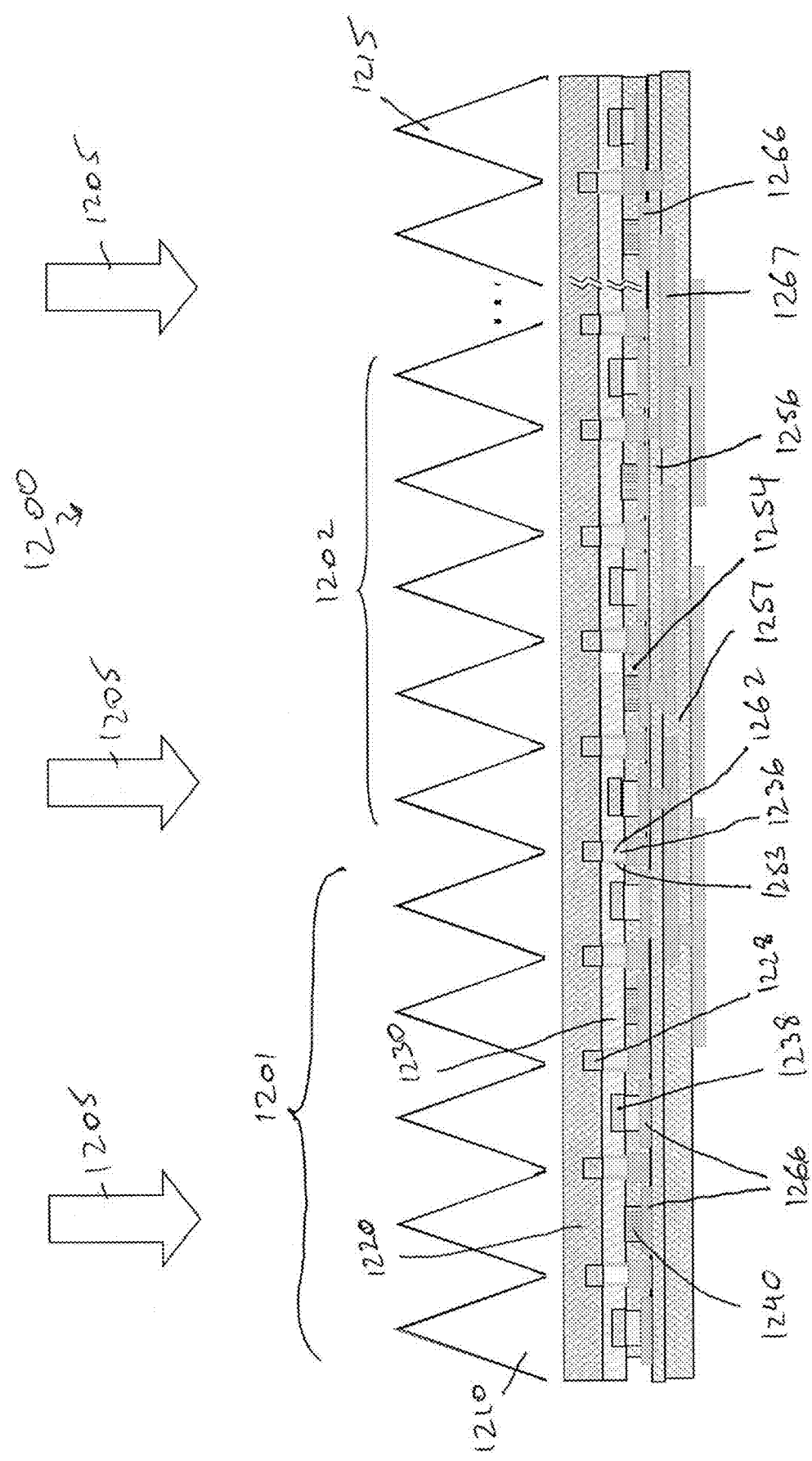
FIG. 12 depicts an embodiment of a detector according to the present disclosure.

Referring to FIG. 12, in one embodiment, a detector array 1200 is presently disclosed. In one embodiment, the detector array 1200 comprises one or more detector pixels 1201, 1202 as shown in FIG. 12. In one embodiment, at least one detector pixel 1201, 1202 comprises three individual electrical contacts 1225, 1235, 1245.

Although present figures and description disclose a two-band detector that absorbs incident light 1205 of two bands (e.g., band-1 and band-2) that both are mid-wavelength infrared (MWIR) wavelengths (i.e., MWIR1 and MWIR2), it is to be understood that the presently disclosed embodiments also can be configured to detect short-wavelength infrared (SWIR) and MWIR wavelengths. In another embodiment, the presently disclosed embodiments can be configured to detect MWIR and long-wavelength infrared (LWIR) bands. In present descriptions, band-1 refers to the shorter-wavelength band and band-2 refers to the longer-wavelength band.

Referring to FIG. 12, in one embodiment, the detector array 1200 comprises a first layer 1220 of material that absorbs incident light 1205 in, for example, the shorter-wavelength band (e.g., MWIR1) and a second layer 1230 of material that absorbs incident light 1205 in, for example, the longer-wavelength band (e.g., MWIR2). The specific bands absorbed depend on the cut-off wavelength of the absorption spectra for the light-absorbing materials comprising layers 1220 and 1230. In one embodiment, the first layer 1220 comprises InAs material with a cut-off wavelength of approximately 3.3 µm at a temperature of about 150K. In one embodiment, the second layer 1230 comprises an InAsSb material that has a cut-off wavelength of approximately 4.9 µm at a temperature of about 150K. In another embodiment, the second layer 1230 comprises an InAs/GaSb binary superlattice material that is designed for a desired MWIR2 (or even a LWIR) cutoff wavelength. In one embodiment, both the first layer 1220 and the second layer 1230 are lightly doped n-type.

In one embodiment, the first layer 1220 is disposed closer to the incident light 1205 than the second layer 1230. In this embodiment, the incident light 1205 passes through the first layer 1220 before reaching the second layer 1230. The shorter-wavelength components of the incident light 1205 are absorbed, at least partially, by the first layer 1220, before they reach the second layer 1230. However, the longer-wavelength components of the incident light 1205 (e.g., wavelengths much longer than 3.5 µm given the exemplary materials presently disclosed) are not absorbed by the first layer 1220 but are transmitted through the first layer 1220 to the second layer 1230.

Figure 14:
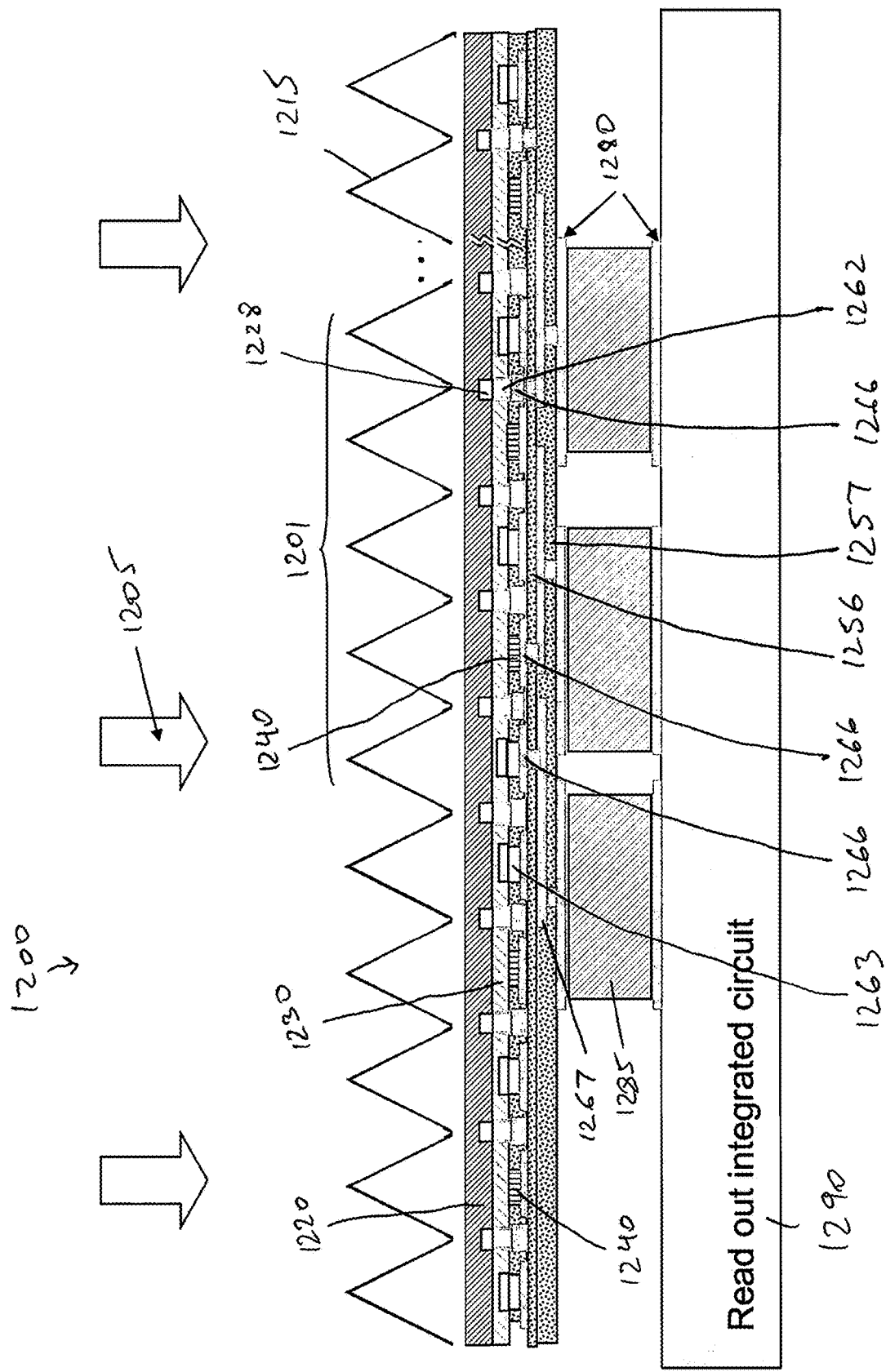
FIG. 14 depicts another embodiment of a detector according to the present disclosure.

In some embodiments, the presently disclosed detector array 1200 comprises collector regions 1240 disposed on the side of the second absorber layer 1230 opposite the incident light 1205 (and also opposite the first absorber layer 1220). In one embodiment, the collector regions 1240 comprise material similar to the one used for the second absorber layer 1230 so that it also absorbs, for example, the MWIR2 band light. In another embodiment, the collector regions 1240 comprises material, such as InAs or GaInAsSb, that has a sufficiently wide electronic bandgap that the collector regions 1240 are transparent to incident light 1205 in, for example, the MWIR2 band. In one embodiment, the collector regions 1240 are heavily doped (e.g., n-type, like the second absorber layer 1230) to facilitate the fabrication of Ohmic contacts to that material. In one embodiment, each detector pixel 1201, 12102 has multiple separate collector regions 1240, as depicted in FIG. 12 and FIG. 14. In another embodiment, each detector pixel 1201, 12102 has one collector region 1240, as depicted in FIGS. 15b and 15c.

Figure 13:
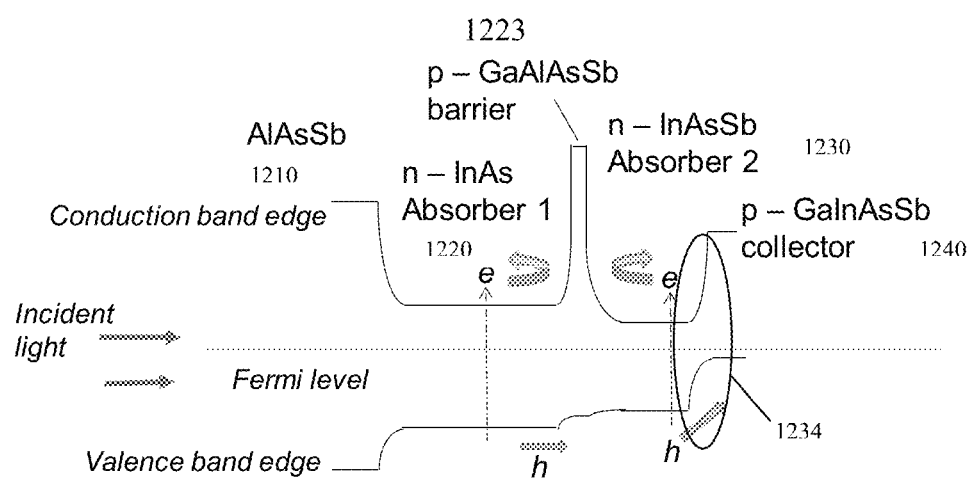
FIG. 13 depicts energy band structure according to the present disclosure.

In some embodiments, the detector array 1200 comprises a first carrier-selective barrier 1223 that is located between the first light-absorbing layer 1220 and the second light-absorbing layer 1230, as illustrated in FIG. 13. In some embodiments, the detector array 1200 comprises a second carrier-selective barrier 1234 that is located between the second light-absorbing layer 1230 and the collector regions 1240. In some embodiments, the first barrier 1223 is designed to block the flow of electrons between the first light-absorbing layer 1220 and second light-absorbing layer 1230. In some embodiments, the first barrier 1223 may be configured to permit the flow of holes from the first light absorbing layer 1220 to the second light-absorbing layer 1230. In some embodiments, the first barrier 1223 may be configured to at least partially block the flow of holes from the second light-absorbing layer 1230 to the first light-absorbing layer 1220. As a result, photo-generated minority carriers (i.e., holes) produced in the first light-absorbing layer 1220 from absorption of the MWIR1 band light pass through the first barrier 1223 into the second light-absorbing layer 1230. The photo-generated majority carriers (i.e., electrons) produced in the first light-absorbing layer 1220 remain in the first light-absorbing layer 1220, because of the first barrier 1223, and are conducted to the electrical contacts 1225 abutting that layer 1220.

In some embodiments, the first barrier 1223 is formed by forming a thin layer of wide bandgap material, such as, for example, AlInAsSb and/or GaAlAsSb, between the first light-absorbing layer 1220 and second light-absorbing layer 1230 and by selecting the materials used for the two light-absorbing layers and for the first barrier such that there is an electronic energy barrier formed in the conduction band to the flow of electrons between the two light-absorbing layers 1220, 1230, as illustrated in FIG. 13. In some embodiments, the energy-band structure achieved with the combination of the first barrier 1223 and the two light-absorbing layers 1220, 1230 also presents an electronic barrier in the valence band that hinders the flow of holes from the second light-absorbing layer 1230 to the first light-absorbing layer 1220 but that permits the flow of holes from the first light-absorbing layer 1220 to the second light-absorbing layer 1230.

Again with reference to FIG. 13, in some embodiments, the second barrier 1234 is configured to block the flow of electrons between the second light-absorbing layer 1230 and the collector regions 1240. The second barrier 1234, however, is configured to permit the flow of holes from the second light absorbing layer 1230 to the collector regions 1240. As a result, photo-generated minority carriers (i.e., holes) produced in the second light-absorbing layer 1230 as a result of absorption of the MWIR2 band light pass through the second barrier 1234 to the collector regions 1240 to be collected. However, the photo-generated majority carriers (i.e., electrons) produced in the second light-absorbing layer 1230 remain in that layer, trapped by the barriers 1223 and 1234, and are conducted to the electrical contacts abutting the second light-absorbing layer 1230. The photo-generated minority carriers (i.e., holes) produced in the first light-absorbing layer 1220 as a result of absorption of the MWIR1 band light that pass through the first barrier 1223 into the second light-absorbing layer 1230 also pass through the second barrier 1234 to the collector regions 1240 to be collected. Thus, the collector regions 1240 of the detectors 1201, 1202 collect the photo-generated minority carriers (i.e., holes) associated with light in both wavelength bands.

In some embodiments, at least a portion of the second light-absorbing layer 1230 is laterally contiguous and extends over multiple detector pixels 1201 and 1202. This provides a path for the majority carriers resulting from absorption of the MWIR2 light to flow through multiple detector pixels 1201, 1202 to a contact that collects carriers associated with multiple pixels. In some embodiments, the first light-absorbing layer 1220 is laterally contiguous over multiple detector pixels 1201 and 1202 and provides a path for the majority carriers resulting from absorption of the MWIR1 light to flow through multiple detector pixels 1201, 1202 to another contact the collects carriers associated with multiple pixels. These two paths are electrically separated from each other by the first barrier 1223.

In one embodiment, the collector region 1240 is not contiguous laterally over a given detector pixel 1201, 1202. One or more electrical contacts 1245 are made to the collector regions 1240 of each detector pixel 1201, 1202. Thus, each detector pixel 1201, 1202 has at least one electrical contact 1245 associated with it. The collector contact 1245 provides a signal that is the sum of the two currents for the MWIR1 and MWIR2 bands. The two other contacts 1225 and 1235 separately receive the MWIR1 signal current and the MWIR2 signal current, respectively. These metal contacts also can serve as reflectors of the incident light 1205 not yet absorbed. As the result, the incident light 1205 can potentially make multiple passes through the light-absorbing materials 1220, 1230 of the detector array 1200. In some embodiments, it is possible to have some of the MWIR1 photo-current (or alternatively the MWIR2 photo-current) sensed via a contact made to the detector pixels 1201, 1202 and some of the MWIR1 photo-current may be sensed via a more global contact scheme that combines the MWIR1 photo-currents for several nearby pixels. This capability provides even more flexibility in the potential applications of the presently disclosed detector array 1200.

In one embodiment, the detector array 1200 comprises an anti-reflective coating (not shown) that is formed on the side of the detector array 1200 facing the incident light 1205. This coating (not shown), is configured to minimize the reflection of the incident light 1205 in the two bands to be absorbed.

In some embodiments, the detector array 1200 comprises pyramid-shaped features 1215 that are formed on the side of the detector array 1200 facing the incident light 1205. The pyramid-shaped features 1215 are etched into a layer of material that is located on the incident light side of the first light-absorbing layer 1220. In one embodiment, the pyramid-shaped features 1215 are formed from material that is the same as the material of the first light-absorbing layer 1220. In this embodiment, the pyramid-shaped features 1215 would also absorb the light of the MWIR1 band. Such absorbing pyramids are described in more detail in U.S. Pat. No. 7,928,389 issued on Apr. 19, 2011, which is incorporated herein by reference in its entirety, and described in U.S. application Ser. No. 13/372,366 "Wideband Detector Structure" filed on Feb. 13, 2012, which is incorporated herein by reference in its entirety. In another embodiment, the pyramid-shaped features 1215 could be formed from a layer 1210 of material that has a sufficiently wide bandgap to be transparent to light of both the MWIR1 and MWIR2 bands. Examples of such a material include InAlAsSb, GaAlSb, AlAsSb and/or AlSb. Materials such as AlAsSb and/or AlSb are especially useful because the heterojunction interface they have with the n-type InAs material for the first light-absorbing layer 1220 presents a barrier to both the electrons and the holes generated in the first light-absorbing layer 1220 that keeps those carriers from leaking into the pyramidal region. Light absorbing structures with transparent pyramids are described in U.S. application Ser. No. 13/372,366 "Wideband Detector Structure" filed on Feb. 13, 2012, which is incorporated herein by reference in its entirety. The pyramid-shaped structures, whether absorbing or transparent, serve to greatly reduce the front-side reflection of the incident light 1205. Thus, the incident light 1205 is transmitted into the light-absorbing layers 1220, 1230 of the detector array 1200. In one embodiment, the pyramid-shaped features 1215 are made from material of high refractive index and they also serve to couple the incident light 1205 into characteristic modes of the detector array 1200 such that the light becomes trapped in the detector array 1200, essentially making a plurality of passes through the light-absorbing layers 1220, 1230. This photon-trapping effect greatly improves the absorption efficiency of the detector array 1200.

Figure 1B:
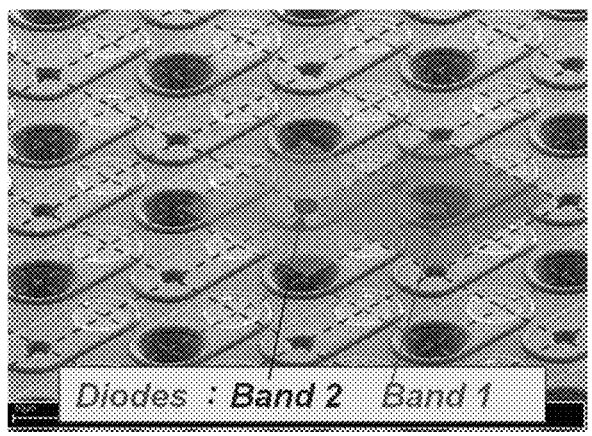
Figure 2:
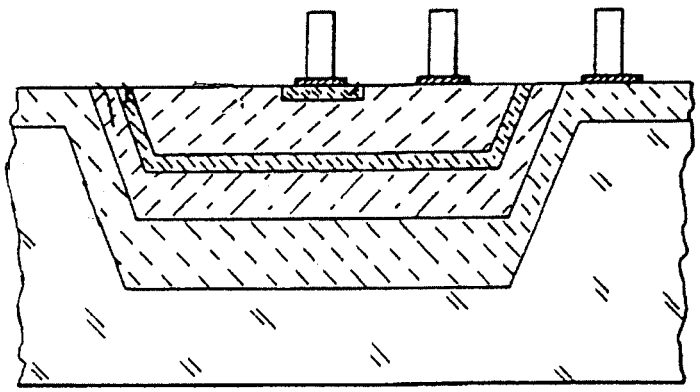
FIG. 2 depicts another detector known in the art.
Figure 3A:
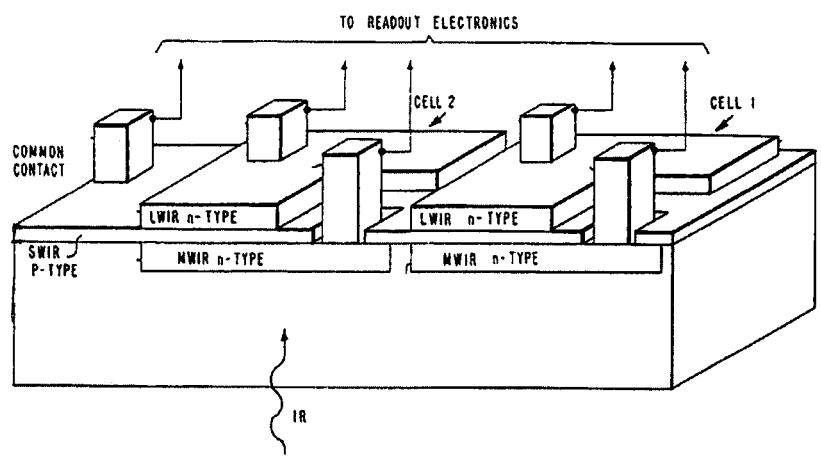
FIGS. 3a-b depict another detector known in the art.
Figure 3B:
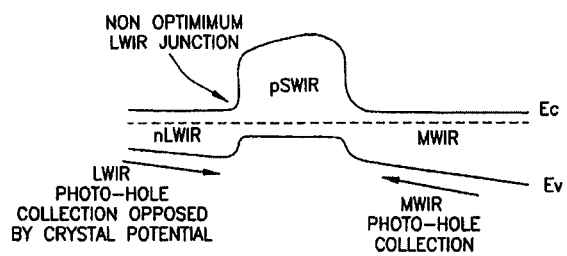
Figure 4A:
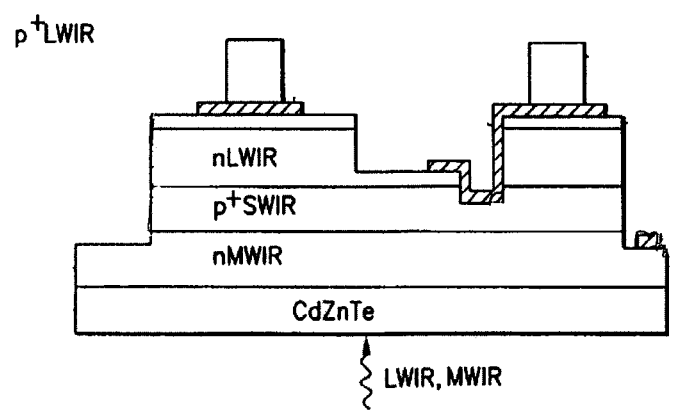
FIGS. 4a-b depict another detector known in the art.
Figure 4B:
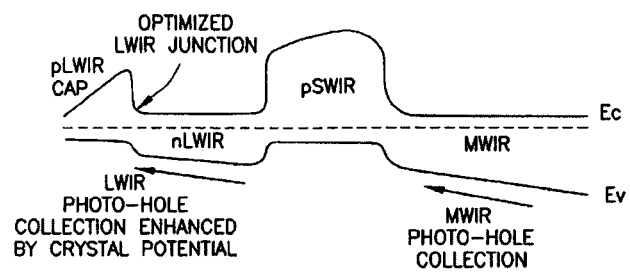
Figure 5A:
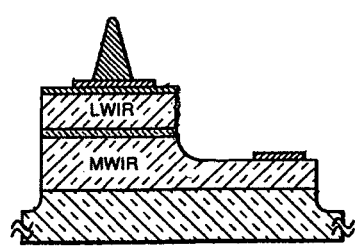
FIGS. 5a-c depict another detector known in the art.
Figure 5B:
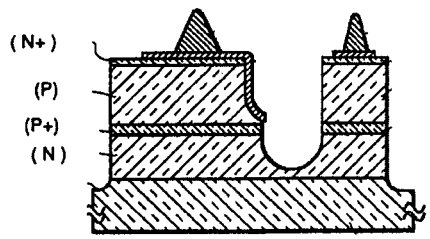
Figure 5C:
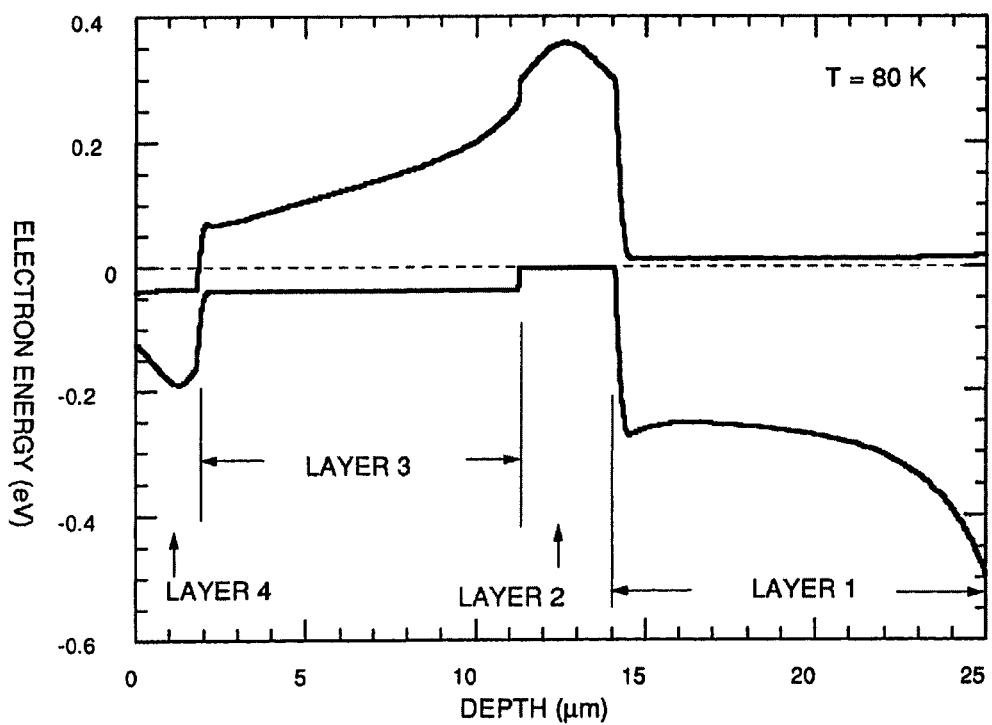
Figure 6:
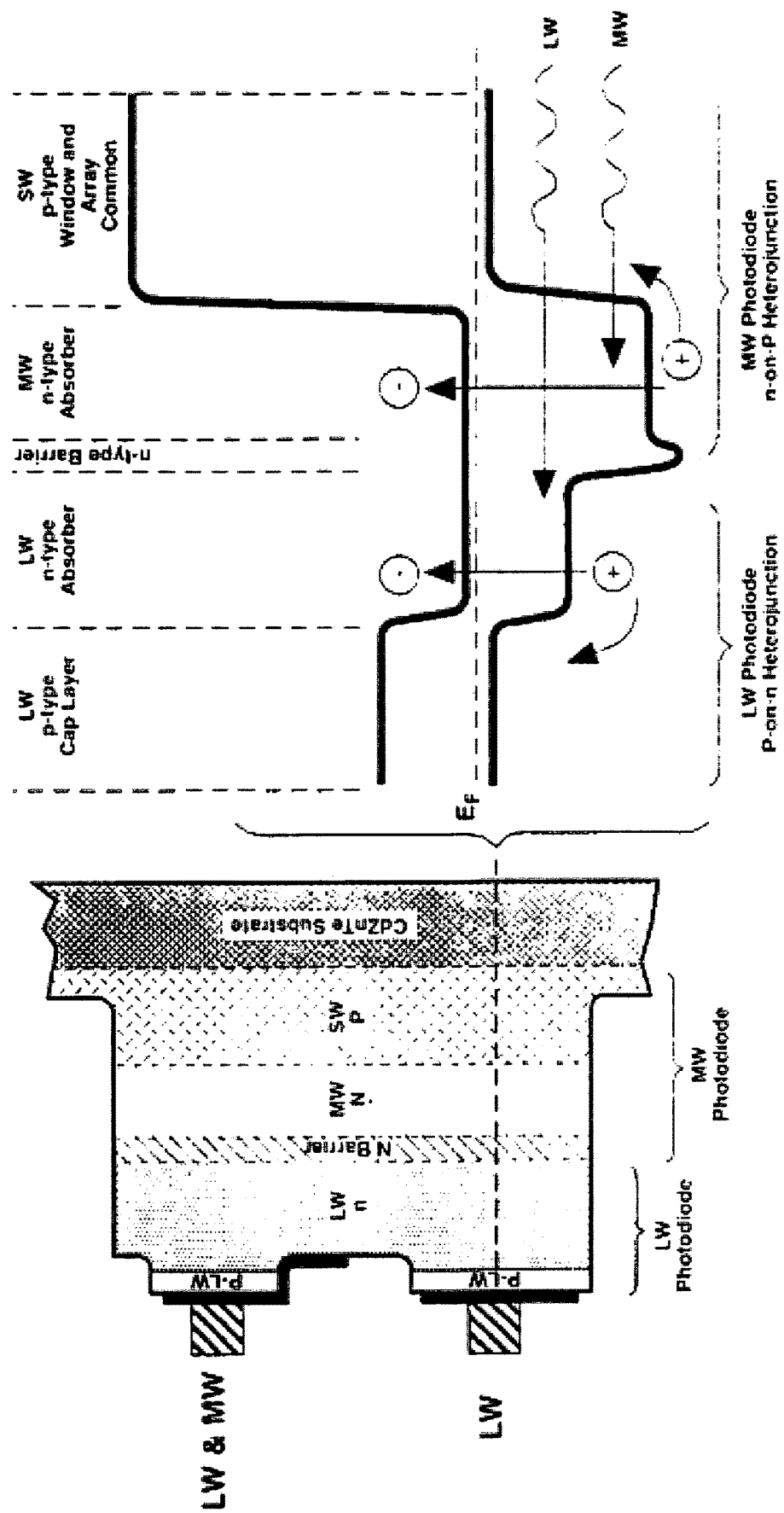
FIG. 6 depicts another detector known in the art.
Figure 7:
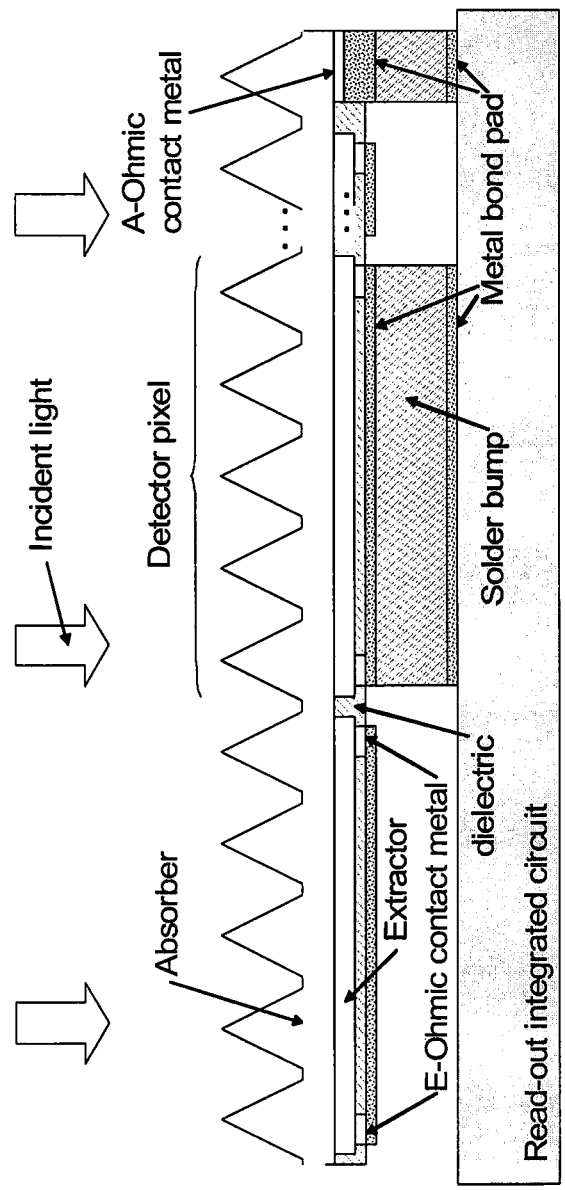
FIG. 7 depicts another detector known in the art.
Figure 8:
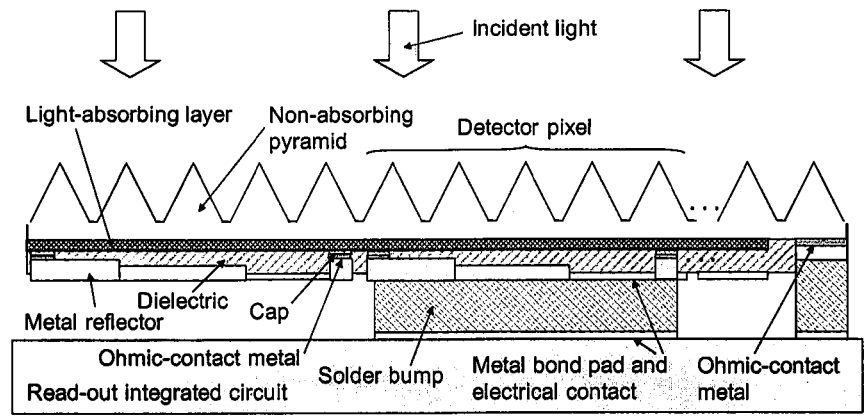
FIG. 8 depicts another detector known in the art.
Figure 9:
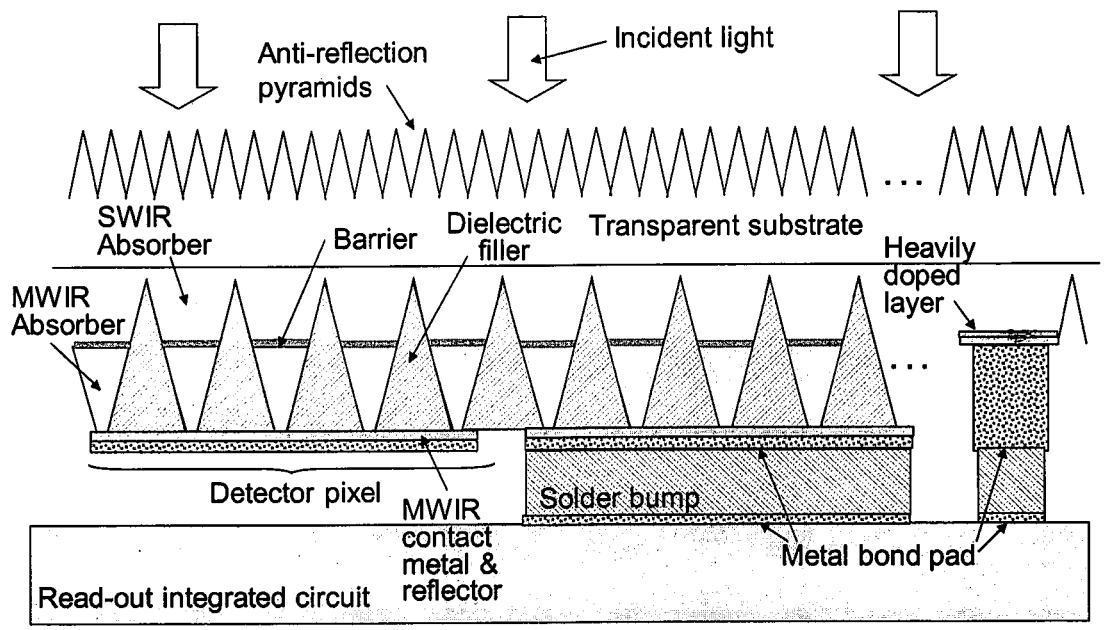
FIG. 9 depicts another detector known in the art.

In some embodiments, the thickness of the second light-absorbing layer 1230 can be greatly reduced and still achieve high absorption efficiency. The thickness of the second light-absorbing layer 1230 can be about 1.0-1.5 μm while achieving an absorption efficiency of about 80% or higher. This thickness is much smaller than the thickness of the absorber layers in prior art detector designs such as those described in FIGS. 1-6. As a result, the size of the via-holes 1236 that must be etched through the second light-absorbing layer 1230 to permit the formation of electrical contacts to the first light-absorbing layer 1220 can be much smaller. For example, a size of 2 μm represents an aspect ratio of only 1:2 for the via-hole 1236. For example, a via-hole size of 1 μm also is feasible. In contrast to the present disclosure, the prior detector shown in FIG. 1 has a minimum via-hole size of 8-10 μm since the thickness of its absorber layer for the longer-wavelength band is approximately 5 μm, and with that thickness of its absorber that prior detector has a quantum efficiency of only 50%. The size of the via-hole constrains the overall size of the detector pixel. In one embodiment, the presently disclosed detector array 1200 has a pixel size smaller than about 20 μm.

Figure 15A:
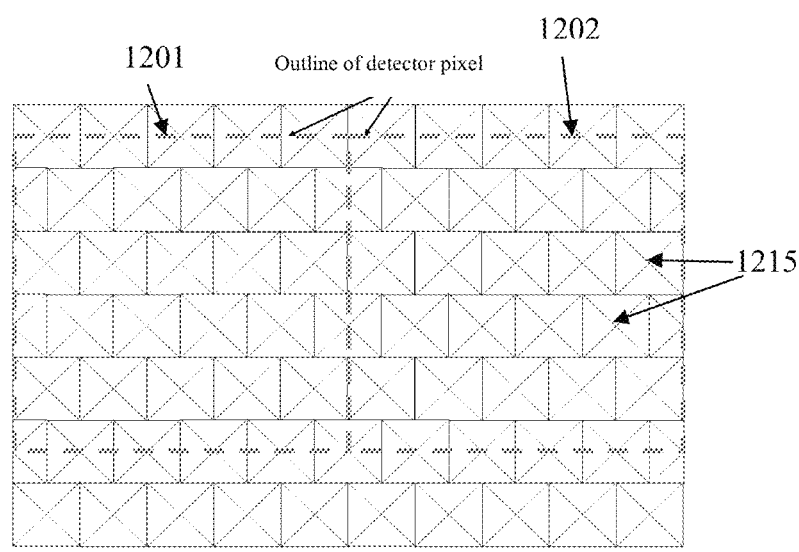
Figure 15C:
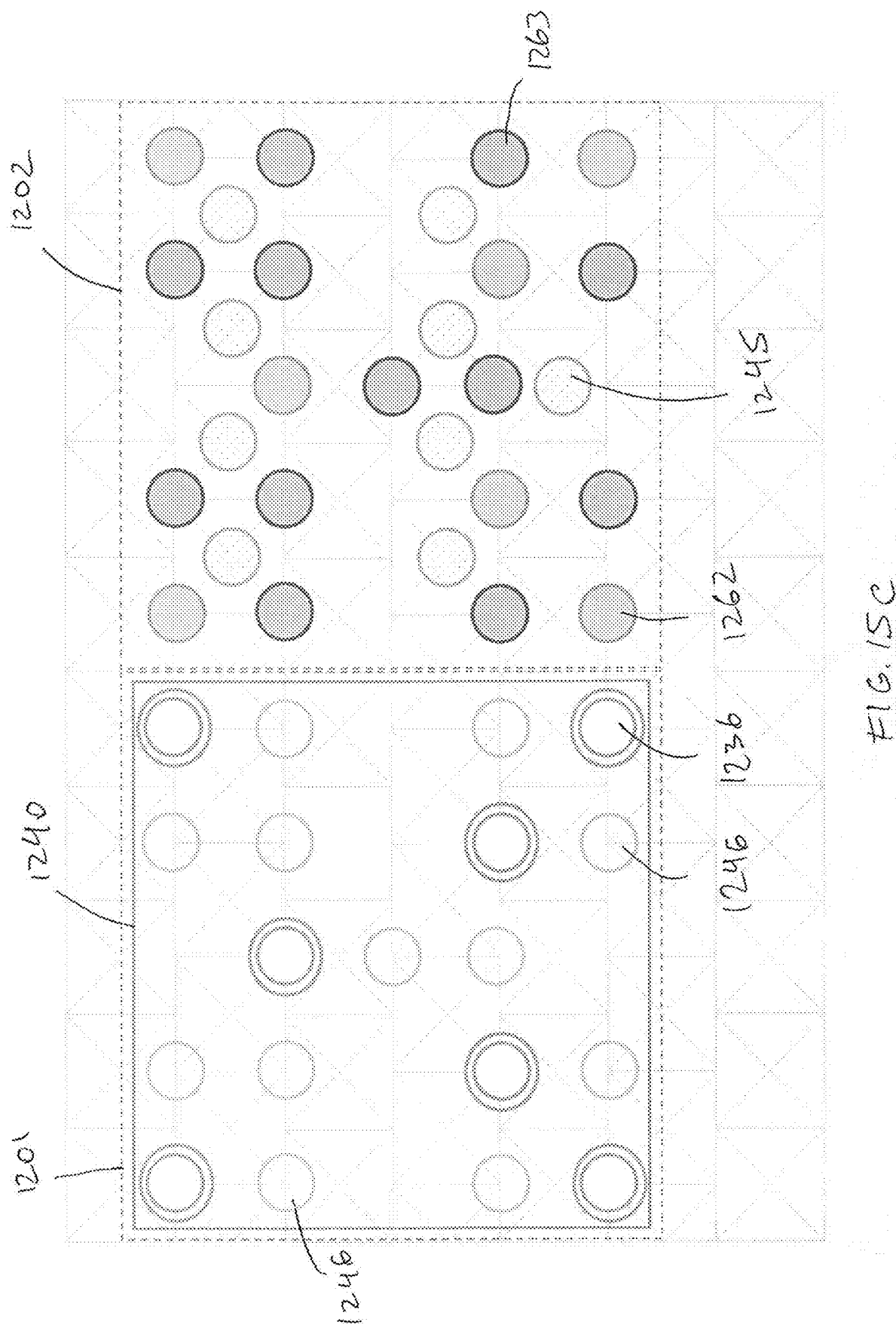
FIG. 15c depicts another embodiment of a detector according to the present disclosure.

With reference to FIGS. 14 and 15*a-b*, in some embodiments, the detector pixel 1201 comprises at least one electrical contact 1245, which is, for example, an Ohmic contact, that is electrically coupled with the collector region 1240. In one embodiment, the collector region 1240 is heavily doped. In some embodiments, the detector pixel 1201 further comprises at least one electrical contact 1225, which is, for example, an Ohmic contact, that is electrically coupled with the first light-absorbing layer 1220. In some embodiments, the detector pixel 1201 comprises at least one region 1228 of heavy n-doping formed in the first light-absorbing layer 1220 adjacent with the at least one electrical contact 1225 using, for example, ion implantation and post-implant annealing to facilitate the fabrication of a low-resistance electrical contact. In some embodiments, the detector pixel 1201 further comprises at least one electrical contact 1235, which is, for example, an Ohmic contact, that is electrically coupled with the second light-absorbing layer 1230. In some embodiments, the detector pixel 1201 comprises at least one region 1238 of heavy n-doping formed in the second light-absorbing layer 1230 adjacent with the at least one electrical contact 1235 using, for example, ion implantation and post-implant annealing to facilitate the fabrication of a low-resistance electrical contact.

In some embodiment, the detector pixel 1201 comprises the pyramidal structures 1215. In some embodiments, the absorption of incident light 1205 is greater in those portions of the first light-absorbing layer 1220 that are located near the peak of a pyramidal structures 1215 and less effective in those portions that are located near the outer base of the a pyramidal structures 1215. Since it is beneficial to minimize the amount of MWIR1 band light that is not absorbed by the first absorber layer 1220 but that instead is absorbed by the second absorber layer 1230, in some embodiments, the via-holes 1236 formed in the second absorber layer 1230 are formed to coincide with the outer base regions of the pyramidal structures 1215. The via holes 1236, which remove absorber material that could otherwise generate the electrons and holes for useful photo-current, are preferably located under the outer edges of the pyramid structures 1215 as shown in FIG. 14. In some embodiments, the sidewalls of the via-holes 1236 are covered with a dielectric passivation film 1254. In some embodiments, the via-holes 1236 are filled with metal posts 1262 or metal film to provide the electrical conduction from the Ohmic contacts 1225 to the backside of the detector pixel 1201.

In some embodiments, the backside of the detector is covered with a reflector such as, for example, a metal film. In some embodiments, the reflector is discontinuous and/or composed of separated pieces of metal film 1266, 1267. In some embodiments, the reflector is separated from the light-absorbing layer 1230 by a dielectric spacer 1254 that has low refractive index.

In some embodiments, the detector array 1200 is electrically coupled with a read-out integrated circuit 1290 as implemented in a focal plane array imager. In some embodiments, the detector array 1200 is electrically coupled with a read-out integrated circuit 1290 through one or more solder bumps 1285 and one or more metal bond pads 1280 as depicted in FIG. 14.

In some embodiments, the detector pixels 1201, 1202 of the detector array 1200 comprise one or more layers of metal interconnect 1266, 1767 patterns and bond pads 1280, with the metal interconnect 1266, 1267 layers and bond pads 1280 separated, for example, by layers of dielectric spacers 1256, 1257. Such a multi-layer interconnect structure permits cross-overs in the interconnect pattern and allows for contact pads that are larger and that can be placed over the via-holes 1262, 1263. When such a multi-layer interconnect is used, the pattern of contact pads and solder bumps 1285 formed on the detector array 1200 can be determined by the needs of the readout integrated circuit (ROIC) 1290 rather than by the constraints of the pyramidal structures 1215 and ohmic contacts of the various light-absorbing regions 1220, 1230.

In some embodiments, the dimensions of the pyramid structures 1215 that are formed on the side of the detector array 1200 facing the incident light 1205 can be designed to minimize the front-side reflection of the incident light 1205 as well as to maximize the trapping of those incident photons in the detector array 1200. For example, in order to obtain good anti-reflection for all of the MWIR wavelengths of light to be detected, in some embodiments, the width of the pyramid structures 1215 is as large as or larger than the one-half the longest wavelength of the light to be absorbed by the detector array 1200. Thus, if the longest wavelength of absorbed light is 5 μm, the width of the pyramid structures 1215 at their base is at least 2.5 μm. In some embodiments, the height of the pyramid structures 1215 is on the order of or slightly larger than the longest wavelength of the light to be absorbed. Thus, if the longest wavelength of the light to be absorbed is 5 μm, the height of the pyramid structures 1215 would be around 5 μm or larger. The pyramid structures 1215 form a continuous pattern on the side of the detector array 1200 facing the incident light 1215, as illustrated in FIG. 15*a* which depicts a partial top view of the detector array 1200. In some embodiments, the detector pixel 1201 and/or 1202 comprises many pyramidal structures 1215. In some embodiments, the pyramidal structures 1215 are arranged in a staggered manner (i.e. an offset-grid arrangement), as illustrated in the FIG. 15*a*. In some embodiments, the pyramid structures 1215 are arranged in any other pattern that provides a desired anti-reflection and photon retention property. When the detector array 1200 is viewed from the side facing the incident light 1215, the locations and the size of the detector pixels 1201, 1202 are not easily apparent because of the continuous pattern of pyramidal structures 1215. FIG. 15*b* shows one possible configuration of the via-holes 1236 and the metal posts and collector contacts that may be formed in the detector pixel 1201 and/or 1202, as viewed from the back side of the array 1200 through several cross-sections made through the structure. Assuming, for example, a pyramid base width of about 3 μm, the pixel-to-pixel as illustrated in FIG. 15*b* is about 15 μm. The via-holes 1236 that are etched through the second light-absorbing layer 1230 to permit contacts to be made to the first light-absorbing layer 1220 are shown in the detector pixel 1201 depicted in FIG. 15*b*. In some embodiments, the via-holes 1236 are located at the edges of the detector pixel 1201. Also shown are the shallow vias 1246 etched through the collector region 1240 to permit contacts to be made to the second light-absorbing layer 1230. In some embodiments, the shallow vias 1246 are located at the edges of the detector pixel 1201.

The locations of the metal posts that are inside the via-holes 1236 and the shallow vias 1246 are shown in the detector pixel 1202 depicted in FIG. 15*b*. Also shown in the detector pixel 1202 depicted in FIG. 15*b* are the possible locations of the contacts 1245 made to the collector region 1240. Since the collector region 1240 does not extend over multiple pixels, the current extracted by means of the contacts 1245 made to the collector region 1240 of a given pixel is specific to that pixel. In some embodiments, the second absorber layer 1230 and also the laterally continuous portion of the first absorber layer 1220 are quite thin compared to the lateral size of the detector pixel 1201 and/or 1202. Thus, the photo-generated hole-current flows into the collector region of that detector pixel rather than flowing laterally into an adjacent detector pixel.

The extraction of the majority-carrier currents conducted in the first absorber layer 1220 and in the second absorber layer 1230 can be constrained by the locations and density of the contacts 1225 and 1235 made to those layers. The contacts 1225 and 1235 are accessed by means of the posts 1262 and 1263 in the via-holes 1236 and 1246 formed in the second absorber layer 1230 and in the collector region 1240, respectively. FIG. 15*b* illustrates an embodiment in which a pixel 1201, 1202 has high density of contacts 1225 and 1235 located around the perimeter of the pixel. For this other embodiment, most of the photo-current from absorption of the band-1 light and the band-2 light in a given pixel is extracted through the contacts made to that pixel, with only a small amount of photo-current being conducted to other pixels. FIG. 15*c* illustrates another embodiment in which a pixel 1201, 1202 has a lower density of contacts 1225 and 1235 located around the perimeter of the pixel. For this embodiment, more of the photo-current from absorption of the band-1 light and the band-2 light in a given pixel can be conducted through absorber layer 1220 and absorber layer 1230 into the pixels adjacent to that given pixel.

In one embodiment, the size of the contacts made to the band-1 absorber layer 1220, the band-2 absorber layer 1230 and the collector regions 1240 is, for example, about 1 µm. It is possible to have many contacts of this size within the overall area of the detector pixel 1201, 1202, even though the detector pixel size is, for example, about 15×15 µm. In some embodiments, a multi-layer metal interconnect structure is used to electrically connect the small contacts to the pads 1280 used for the solder bumps 1285 associated with each detector pixel 1201, 1202, as well as to the pads 1280 for solder bumps 1285 that may be associated with multiple detector pixels 1201, 1202. In some embodiments, the interconnect structure can be fabricated using high-yield techniques practiced in fabricating electronic integrated circuits. Because the presently disclosed detector array 1200 makes use of a multi-layer vertical interconnect structure rather than using lateral metal-interconnect paths that traverse the sides of tall mesas, as used in prior detector arrays such as those illustrated in FIGS. 1, 4, 5 and 6, the size of the pixel in the presently disclosed array 1200 can be much smaller.

Figure 16:
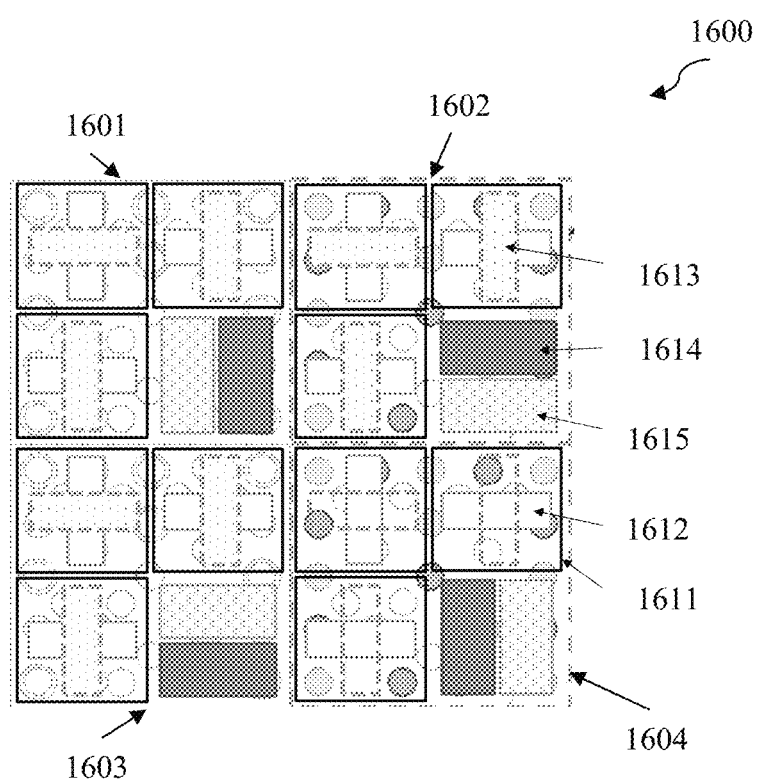
FIG. 16 depicts another embodiment according to the present disclosure.

With available aligners for chip-to-chip bonding, it is possible to achieve an alignment accuracy of 1 µm. Also, the solder bumps 1285, which typically comprise indium material but also could comprise other materials such as AuSn or PbSn or AuIn, can have a lateral dimension of 3 to 10 µm and a vertical thickness of 3 to 10 µm. Thus, it is possible to locate three solder bumps within the area of a pixel. When a photo-detector array chip and a ROIC chip 1290 are pressed together to form the bond between their solder bumps, a problem that can occur is that the chips can slide in the lateral direction, resulting in mis-alignment. One way to prevent this sliding of the chips is to form hard stops in both the photo-detector array 1200 chip and the ROIC chip 1290. FIG. 16 illustrates an embodiment that can be used to limit this sliding.

FIG. 16 depicts four detector pixels 1601, 1602, 1603, 1604 of a detector array 1600 and also shows the bond pads 1611 and the solder bumps 1612 that are formed in each of the detector pixels 1601, 1602, 1603, 1604. FIG. 16 further shows the mating solder bumps 1613 that are formed on the ROIC. In this embodiment, the two sets of solder bumps 1612 and 1613, of, for example, rectangular shape, are oriented to form cross patterns after they are bonded together. FIG. 16 also shows stop structures 1614 that are formed on the detector array as well as their mating stop structures 1615 that are formed on the ROIC. In some embodiments, the stop structure 1614, 1615 comprise 5-15 µm tall features of a plated metal (such as gold or nickel). Each of the stop structures 1614, 1615 limits lateral shift in either one X-direction or one Y-direction. Thus the combination of four stops structure 1614, 1615 on four detector pixels 1601, 1602, 1603, 1604 limits lateral shift in all directions.

Figure 17:
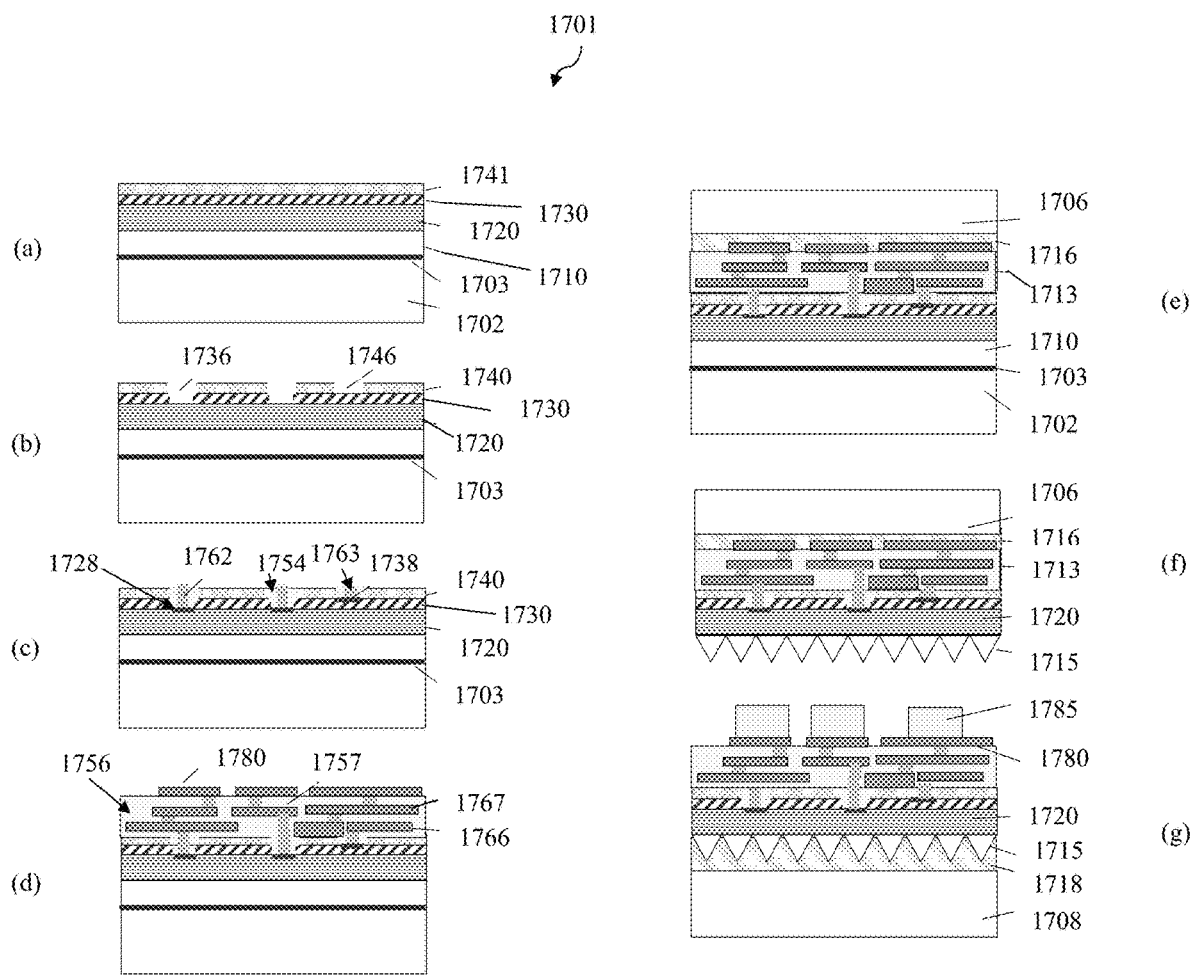
FIG. 17a-g depicts another embodiment according to the present disclosure.
Figure 18:
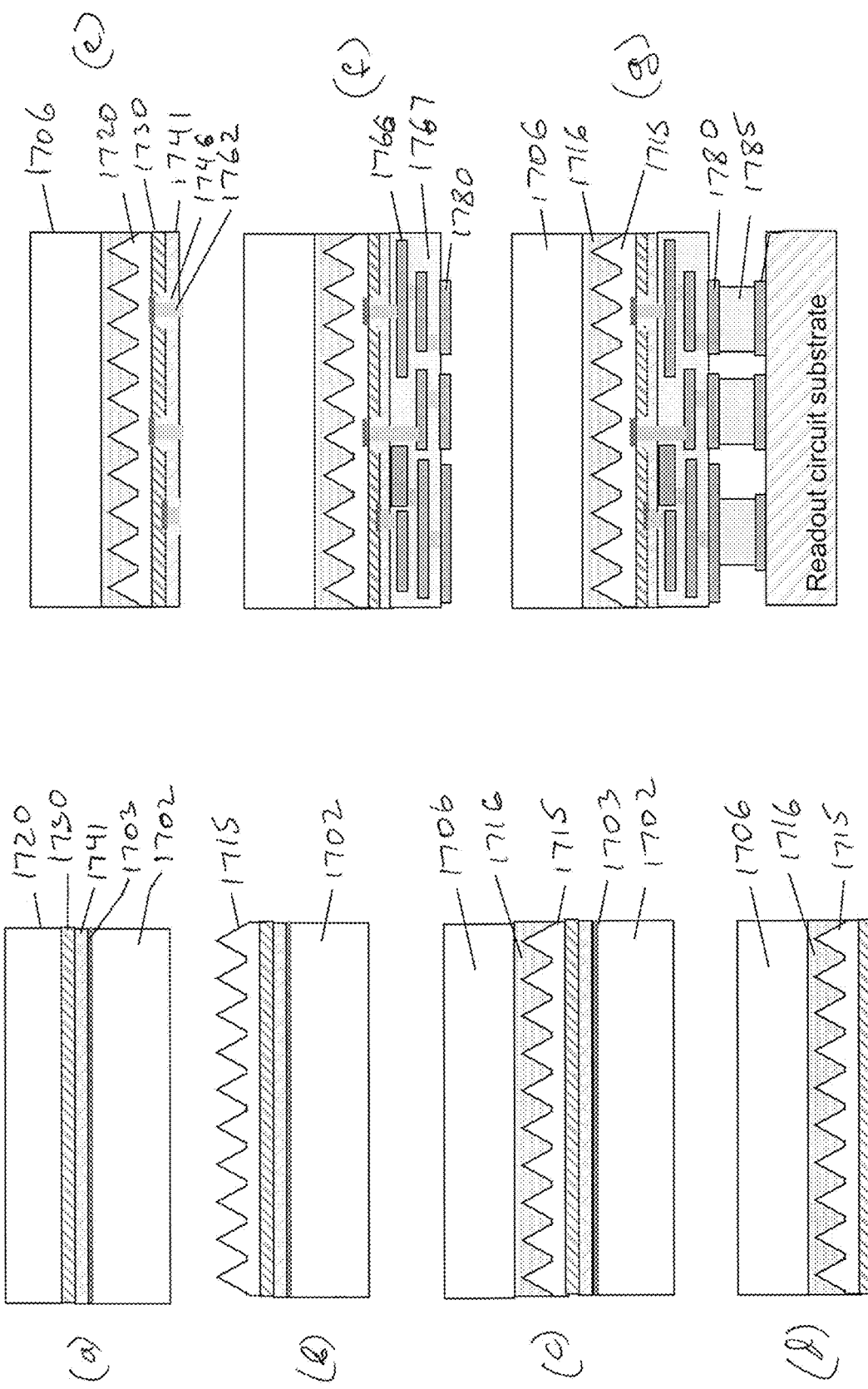
FIGS. 18a-g depict another embodiment according to the present disclosure.

Referring to FIGS. 17*a-g*, in one embodiment, a fabrication process 1701 for the presently disclosed detector array 1200 is presently described. Referring to FIG. 17*a*, the fabrication process 1701 comprises providing a growth substrate 1702; growing a stop-etch layer 1703 above the growth substrate 1702; growing a wide bandgap layer 1710 for the pyramidal structures; growing a band-1 absorber layer 1720; growing a first barrier layer (not shown) adjacent the band-1 absorber layer; growing a band-2 absorber layer 1730; growing a second barrier layer (not shown) adjacent the band-2 absorber layer; and growing a collector layer 1741. Some combination of epitaxial growth processes such as molecular beam epitaxy and metal-organic chemical vapor deposition could be used to grow these layers of material.

Referring to FIG. 17*b*, the fabrication process 1701 comprises etching the collector layer 1741 to form separate collector regions 1740 and shallow via-holes 1746 that penetrate up to the band-2 absorber layer 1730; etching the collector layer 1741 and the band-2 absorber layer 1730 to form deeper via-holes 1736 that penetrate also through the band-2 absorber layer 1730 to the band-1 absorber layer 1720.

Referring to FIG. 17*c*, the fabrication process 1701 comprises optionally defining/forming regions 1728, 1738 to be doped by ion-implantation and annealing. The fabrication process 1701 also comprises depositing and optionally annealing metal portions for Ohmic contacts 1725, 1735, 1745 made to the implanted regions 1728, 1738 and also to the collector regions 1740. The process 1701 also comprises covering the etched features 1736, 1746 with a dielectric passivation layer 1754 and making openings through that dielectric layer to permit access to those metal contacts.

In some embodiments, the dielectric material 1753 filling the via-openings 1736 also passivates the exposed sidewalls of the band-2 absorber layer 1730. Referring to FIG. 17*c*, the fabrication process 1701 comprises forming metal posts 1762 so as to be electrically coupled with the metal contacts 1725 to the band-1 absorber layer 1720 to provide electrical connections between the metal contacts 1725 and additional metal interconnects 1766 formed in a plane defined above the collector layer 1741. These metal posts 1762 may be located in the deep via-openings 1736 extending through the band-2 absorber layer 1730 and through a collector region 1740. The fabrication process 1701 also comprises forming metal posts 1763 so as to be electrically coupled with the metal contacts 1735 to the band-2 absorber layer 1730 to provide electrical connections between the metal contacts 1735 and additional metal interconnects 1766 formed in a plane defined above the collector layer 1741. These metal posts 1763 may be located in the shallow via-openings 1746 extending through a collector region 1740. The fabrication process 1701 also may comprise forming other interconnect lines 1766 to the contacts to the collector regions 1740. In some embodiments, different posts 1762, 1763 are made to different heights such that the result is an approximately co-planar set of metal regions 1766 separated by dielectric material 1754.

Referring to FIG. 17d, the fabrication process 1701 comprises forming metal interconnect lines 1766, 1767. In some embodiments, the metal interconnect lines 1766 are buried by a layer 1756 of dielectric material. Optionally, additional posts are formed through the dielectric layer 1756, for extending the metal connections to metal interconnect lines 1767 in the next interconnect layer, and those interconnect lines 1767 are then buried within another layer 1757 of dielectric material. This process may continue until the final metal layer of the bond pads 1780 is formed. In some embodiments, the various metal contacts, metal interconnect lines and metal bond pads serve as optical reflectors 1713 that help to trap the incidental light in the detector structure, as discussed above.

Referring to FIG. 17e, the fabrication process 1701 comprises coupling a carrier wafer 1706 using, for example, an adhesion layer 1716. Referring to FIG. 17f, the fabrication process 1701 comprises removing the growth substrate 1702. In some embodiments, the stop-etch layer 1703 is used to control the removal of the growth substrate 1702. The stop-etch layer 1703 is then removed after the growth substrate has been removed.

Referring to FIG. 17f, the fabrication process 1701 comprises forming pyramids 1715 in the wide bandgap layer 1710 using, for example, an etching process. In some embodiments, the wide bandgap layer 1710 comprises material such as AlAsSb or AlSb so it can be etched without needing to intentionally elevate the temperature during that etching process.

Referring to FIG. 17g, the fabrication process 1701 comprises coupling a second carrier wafer 1708 using, for example, another adhesion layer 1718; removing the first carrier wafer 1706; and forming solder bumps 1785 above the bond pads 1780.

Optionally, a readout circuit (not shown) is coupled with the solder bumps 1780 and the second carrier wafer 1708 and adhesion layer 1718 are removed to expose the surface with the pyramids 1715.

In another embodiment, the epilayers of the detector array can be grown in the reverse order, as depicted in FIGS. 18a-g. Thus, for this embodiment, the collector layer 1741 could be grown before the growths of the second absorber layer 1730 and the first absorber layer 1720. As depicted in this figure, the pyramids 1715 can be formed directly in the first absorber layer 1720. A carrier wafer 1706 can then be coupled onto the side of the structure facing the pyramids 1715 using, for example, an adhesion layer 1716. The growth substrate 1702 and etch-stop layer 1703 can then be removed to expose the collector layer 1741. Next, the fabrication process steps outlined above with regard to FIGS. 17b-17d and 17g can be used to fabricate the detector array.

In some embodiments, the presently disclosed detectors and imager makes use of new enhancements in the density and capabilities of silicon circuitry. Unlike prior detector arrays, the presently disclosed detector array may provide three outputs for each detector pixel while still achieving small detector area consistent with the needs of the larger-format imagers. In some embodiments, the presently disclosed detectors are used in infrared imagers for collision avoidance, perimeter monitoring, engine diagnosis and monitoring.

In some embodiments, the presently disclosed dual-band detectors, especially because of the reduced volume of their longer-wavelength light-absorbing material, can operate at much higher temperature while still achieving high sensitivity. The higher operation temperature (>130K-200K) made possible by the presently disclosed embodiments could greatly reduce the size and cost of the infrared imaging systems since cryogenic cooling would not be needed.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. An infrared photo-detector comprising:
   a collector region;
   a first absorber layer absorbing a first wavelength band of incident light, wherein the first absorber layer is disposed between the collector region and the incident light;
   a second absorber layer absorbing a second wavelength band of light, wherein the first absorber layer is disposed between the second absorber layer and the incident light;
   at least one first electrical contact coupled with the first absorber layer;
   at least one second electrical contact coupled with the second absorber layer; and
   at least one third electrical contact coupled with the collector;
   wherein the at least one third electrical contact provides a current associated with absorbed light of the first wavelength band and absorbed light of the second wavelength band.

2. The infrared photo-detector of claim 1, further comprising:
   a plurality of layers of metal interconnect lines electrically coupled with the at least one first electrical contact, and
   dielectric material disposed between the plurality of layers of metal interconnect lines.

3. The infrared photo-detector of claim 2, wherein the plurality of layers of metal interconnect lines is configured to reflect light of the second wavelength band.

4. The infrared photo-detector of claim 3, further comprising:
   dielectric material disposed between the plurality of layers of metal interconnect lines and the second absorber layer.

5. The infrared photo-detector of claim 1, further comprising:
   one or more first vias penetrating the second absorber layer; and
   a first metal post or first metal film disposed inside one of the first vias penetrating the second absorber layer, wherein the first metal post or the first metal film is electrically coupled with the first absorber layer.

6. The infrared photo-detector of claim 5, further comprising:
   one or more second vias penetrating the collector region: and
   a second metal post or second metal film disposed inside one of the second vias penetrating the collector region, wherein the second metal post or the second metal film is electrically coupled with the first absorber layer.

7. The infrared photo-detector of claim 1, further comprising:
   one or more vias penetrating the collector region; and
   a metal post or metal film disposed inside one of the vias, wherein the metal post or metal film is electrically coupled with the second absorber layer.

8. The infrared photo-detector of claim 1, further comprising at least one stop configured to control a lateral position of the photo-detector array on a read-out circuit.

9. The infrared photo-detector of claim 1, wherein the thickness of the second absorber layer is smaller than one-half the wavelength of the light of the second wavelength band.

10. The infrared photo-detector of claim 1, further comprising:
    a first barrier layer disposed between the first absorber layer and the second absorber layer; and
    a second barrier disposed between the second absorber layer and the collector.

11. The infrared photo-detector of claim 10, wherein the first absorber layer generates first electrons and first holes and the second absorber layer generates second electrons and second holes, and
    wherein the first barrier layer impedes the flow of the first electrons between the first and second absorber layers and impedes the flow of the second electrons between the first and second absorber layers.

12. The infrared photo-detector of claim 11, wherein the first barrier layer permits the flow of the first holes from the first absorber layer into the second absorber layer.

13. The infrared photo-detector of claim 11, wherein the second barrier impedes the flow of the second electrons from the second absorber layer to the collector region.

14. The infrared photo-detector of claim 11, wherein the second barrier permits the flow of the first holes and second holes from the second absorber layer to the collector region.

15. The infrared photo-detector of claim 14, wherein the second barrier impedes the flow of the first holes and second holes from the collector region to the second absorber layer.

16. The infrared photo-detector of claim 1, wherein the first absorber layer comprises n-type material and the second absorber layer comprises n-type material.

17. The infrared photo-detector of claim 1, wherein the collector region is transparent to the light of the first wavelength and the light of the second wavelength band.

18. The infrared photo-detector of claim 1, further comprising multiple pyramid-shaped features adjacent with the first absorber layer.

19. The infrared photo-detector of claim 1, further comprising multiple pyramid-shaped features formed in the first absorber layer.

20. The infrared photo-detector of claim 1, further comprising:
    a photon trapping structure comprising
       pyramid-shaped features,
       the first and the second absorber layers,
       metal interconnect lines,
       dielectric material disposed between the metal interconnect lines and the second absorber layer, and
       dielectric material disposed between the metal interconnect lines.

21. The infrared photo-detector of claim 1, wherein the infrared photo-detector is a member of an array of multiple photo-detector pixels and
    wherein the first absorber layer extends laterally over multiple photo-detector pixels, and the second absorber layer extends laterally over multiple photo-detector pixels.

22. The infrared photo-detector of claim 21, wherein a spatial arrangement of the one or more first electrical contacts is configured to reduce the conduction of electrical current through the first absorber layer to one or more photo-detector pixels adjacent to the infrared photo-detector.

23. The infrared photo-detector of claim 21, wherein a spatial arrangement of the one or more first electrical contacts is configured to permit the conduction of electrical current through the first absorber layer to one or more photo-detector pixels adjacent to the infrared photo-detector.

24. The infrared photo-detector of claim 21, wherein a spatial arrangement of the one or more second electrical contacts is configured to reduce the conduction of electrical current through the second absorber layer to one or more photo-detector pixels adjacent to the infrared photo-detector.

25. The infrared photo-detector of claim 21, wherein a spatial arrangement of the one or more second electrical contacts is configured to permit the conduction of electrical current through the second absorber layer to one or more photo-detector pixels adjacent to the infrared photo-detector.

26. The infrared photo-detector of claim 1, wherein the at least one first electrical contact provides a current associated with absorbed light of the first wavelength band, the at least one second electrical contact provides a current associated with absorbed light of the second wavelength band.

27. An optical pre-processing imager comprising:
an array of photo-detectors, and
a readout circuit electrically coupled with the array of photo-detectors;
wherein each photo-detector and the readout circuit are electrically connected by at least a first connection and a second connection, wherein the first connection provides a wideband photo-current signal and the second connection provides a narrower bandwidth photo-current signal.

28. The optical pre-processing imager of claim 27, wherein the readout circuit subtracts the wideband photo-current signal from one photo-detector of the array by a signal derived from the narrower bandwidth photo-current signal from another photo-detector of the array.

29. The optical pre-processing imager of claim 27, wherein the readout circuit configures an interconnection between the narrower bandwidth photo-current signal of a first photo-detector of the array of photo-detectors and the connection for providing a wideband photo-current signal of the first photo-detector of the array of photo-detectors.

30. The optical pre-processing imager of claim 27, wherein the readout circuit configures an interconnection between the narrower bandwidth photo-current signal of a first photo-detector of the array of photo-detectors and the connection for providing a wideband photo-current signal of a second photo-detector of the array of photo-detectors.

* * * * *